US010026658B2

(12) United States Patent
Tsai et al.

(10) Patent No.: US 10,026,658 B2
(45) Date of Patent: Jul. 17, 2018

(54) METHODS FOR FABRICATING VERTICAL-GATE-ALL-AROUND TRANSISTOR STRUCTURES

(71) Applicant: Taiwan Semiconductor Manufacturing Company Limited, Hsinchu (TW)

(72) Inventors: Teng-Chun Tsai, Hsinchu (TW); Cheng-Tung Lin, Hsinchu County (TW); Li-Ting Wang, Hsinchu (TW); De-Fang Chen, Hsinchu (TW); Huan-Just Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/251,933

(22) Filed: Apr. 14, 2014

(65) Prior Publication Data
US 2015/0295040 A1 Oct. 15, 2015

(51) Int. Cl.
*H01L 21/336* (2006.01)
*H01L 21/8238* (2006.01)
(Continued)

(52) U.S. Cl.
CPC .. *H01L 21/823885* (2013.01); *H01L 21/3247* (2013.01); *H01L 21/76224* (2013.01); *H01L 21/823807* (2013.01); *H01L 21/823814* (2013.01); *H01L 21/823871* (2013.01); *H01L 21/823878* (2013.01);
(Continued)

(58) Field of Classification Search
CPC ............ H01L 29/0676; H01L 21/3247; H01L 29/7827; H01L 29/66666; H01L 21/823878; H01L 21/823814; H01L 21/823871; H01L 21/823892; H01L 21/32051; H01L 27/0928; H01L 21/76224; H01L 21/823807; H01L 21/26586;
(Continued)

(56) References Cited

U.S. PATENT DOCUMENTS 5,841,173 A * 11/1998 Yamashita .......... H01L 29/0847
257/344
6,861,684 B2 * 3/2005 Skotnicki ............ H01L 21/2807
257/288
(Continued)

OTHER PUBLICATIONS

Chen, Z.X., Singh, N., Kwong, D.-L.; Vertical Silicon Nanowire MOSFET With a Fully-Silicided (FUSI) NiSi2 Gate; World Academy of Science, Engineering and Technology, 57; pp. 681-683; 2011.
(Continued)

*Primary Examiner* — Shouxiang Hu
(74) *Attorney, Agent, or Firm* — Jones Day

(57) ABSTRACT

Systems and methods are provided for fabricating nanowire devices on a substrate. A first nanowire and a second nanowire are formed on a substrate, the first nanowire and the second nanowire extending substantially vertically relative to the substrate. A first source region and a first drain region are formed with n-type dopants, the first nanowire being disposed between the first source region and the first drain region. A second source region and a second drain region are formed with p-type dopants, the second nanowire being disposed between the second source region and the second drain region.

19 Claims, 24 Drawing Sheets

(51) Int. Cl.
*H01L 29/06* (2006.01)
*H01L 27/092* (2006.01)
*H01L 21/762* (2006.01)
*H01L 21/324* (2006.01)
*H01L 29/66* (2006.01)
*H01L 29/78* (2006.01)
*H01L 21/265* (2006.01)
*H01L 21/308* (2006.01)

(52) U.S. Cl.
CPC .. *H01L 21/823892* (2013.01); *H01L 27/0928* (2013.01); *H01L 29/0676* (2013.01); *H01L 29/66666* (2013.01); *H01L 29/7827* (2013.01); *H01L 21/26586* (2013.01); *H01L 21/3083* (2013.01); *H01L 27/092* (2013.01)

(58) Field of Classification Search
CPC ............. H01L 27/092; H01L 29/78642; H01L 21/823885; H01L 21/8234
USPC ....... 438/268, 212, 138, 156, 153, 154, 164, 438/192; 977/938, 762, 840
See application file for complete search history.

(56) References Cited

U.S. PATENT DOCUMENTS

| | | | | |
|---|---|---|---|---|
| 8,080,458 | B2* | 12/2011 | Masuoka | H01L 29/42356 257/E21.41 |
| 8,319,288 | B2* | 11/2012 | Masuoka | H01L 21/823821 257/369 |
| 2005/0227435 | A1* | 10/2005 | Oh | B82Y 10/00 438/257 |
| 2011/0303973 | A1* | 12/2011 | Masuoka | H01L 21/823885 257/329 |
| 2014/0021485 | A1* | 1/2014 | Cho | H01L 29/1054 257/77 |

OTHER PUBLICATIONS

Sleight, J., Bangsaruntip, S., Majumdar, A., Cohen, G., Zhang, Y., Engelmann, S., Fuller, N., Gignac, L., Mittal, S. Newbury, J., Frank, M., Chang, J., Guillorn, M.; Gate-All-Around Silicon Nanowire MOSFETs and Circuits; Device Research Conference; pp. 269-272; 2010.

* cited by examiner

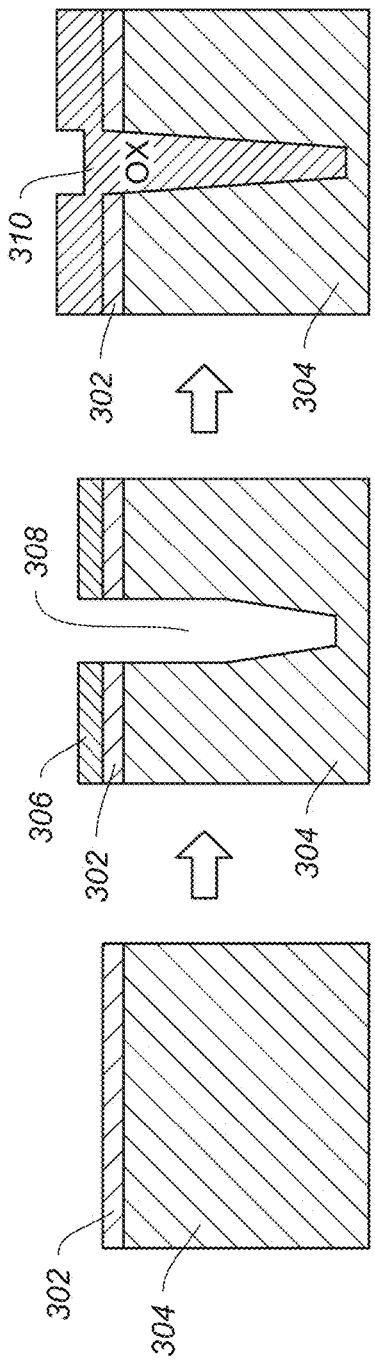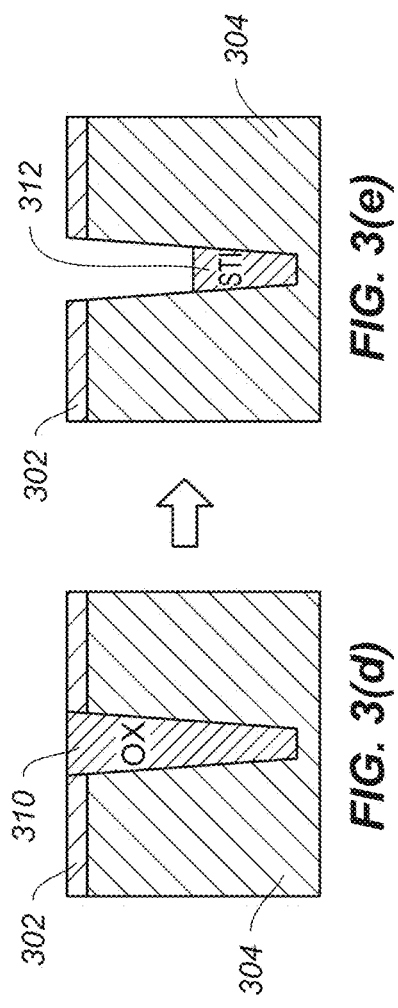

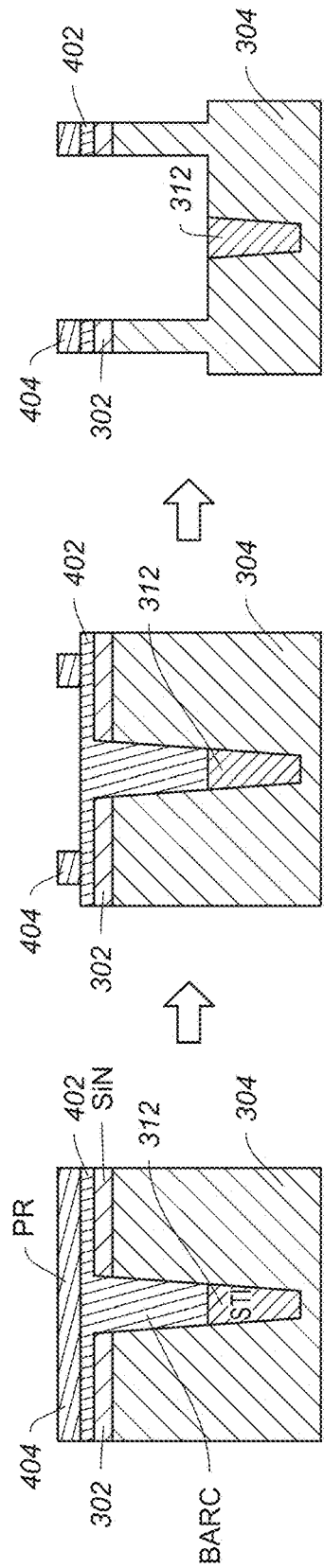
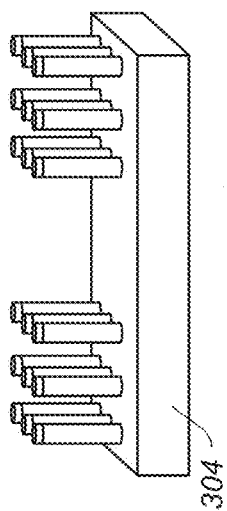
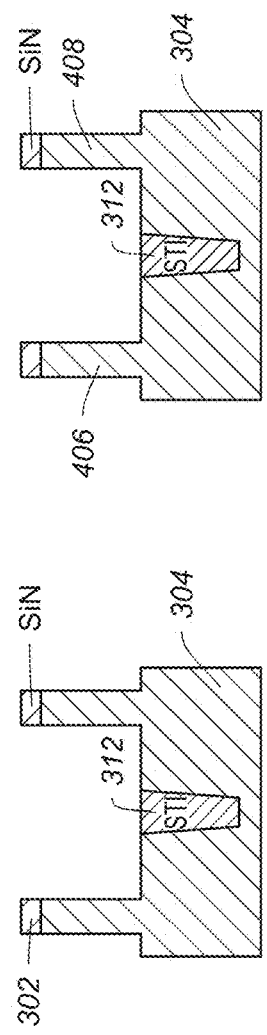
FIG. 4(a) FIG. 4(b) FIG. 4(c)
FIG. 4(d) FIG. 4(e) FIG. 4(f)

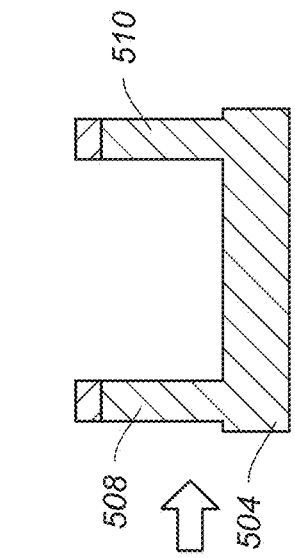
FIG. 5(a)  FIG. 5(b)  FIG. 5(c)
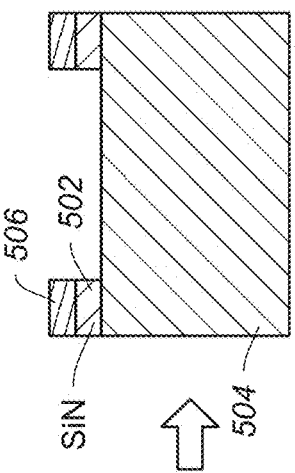
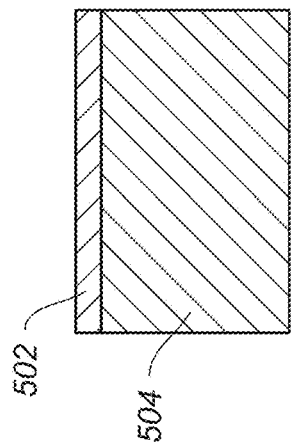
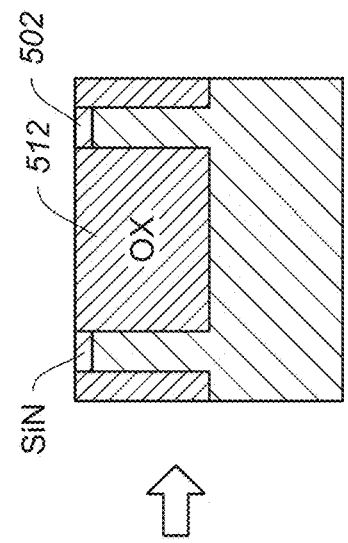
FIG. 5(d)  FIG. 5(e)  FIG. 5(f)
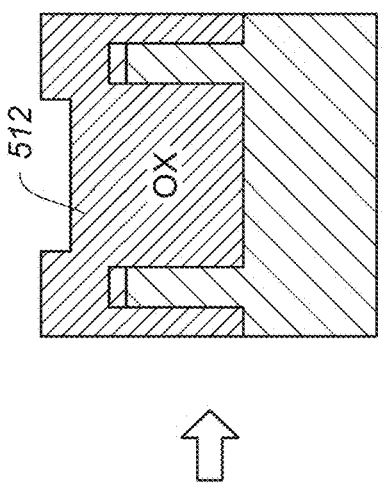
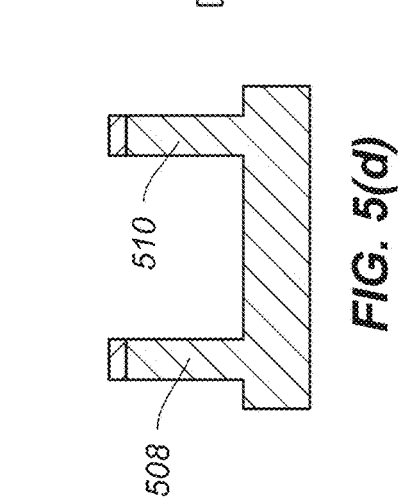

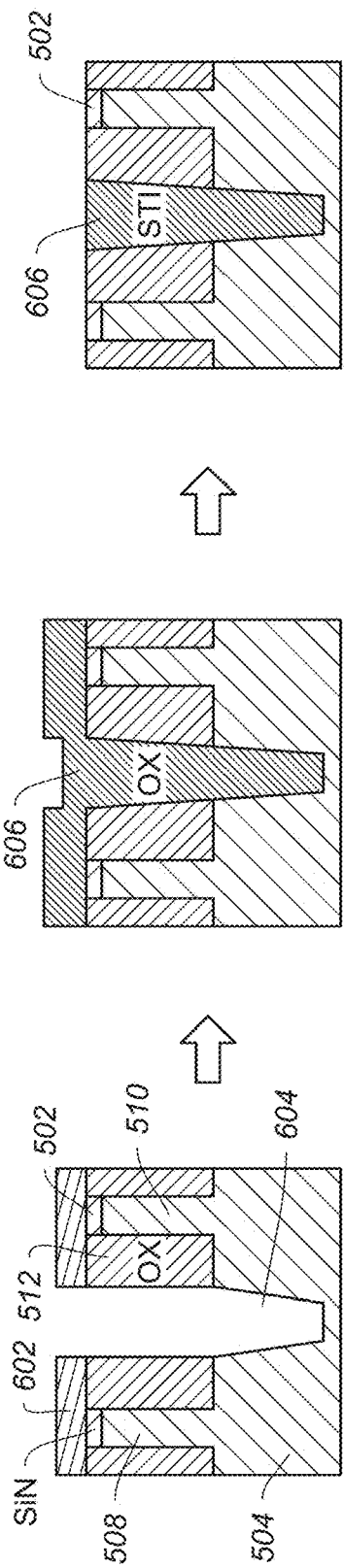
FIG. 6(c)
FIG. 6(b)
FIG. 6(a)
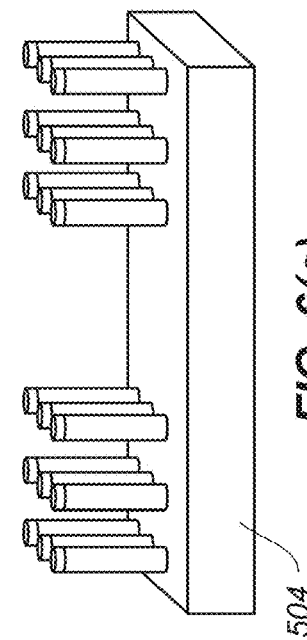
FIG. 6(e)
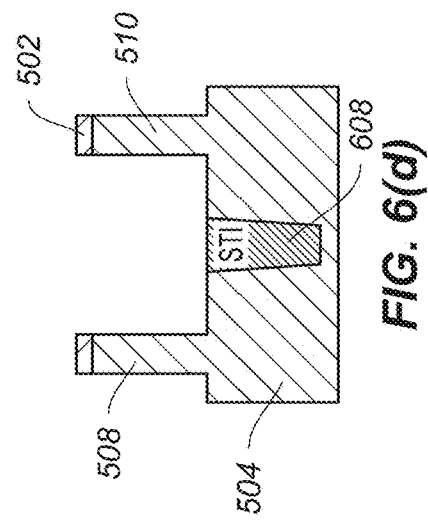
FIG. 6(d)

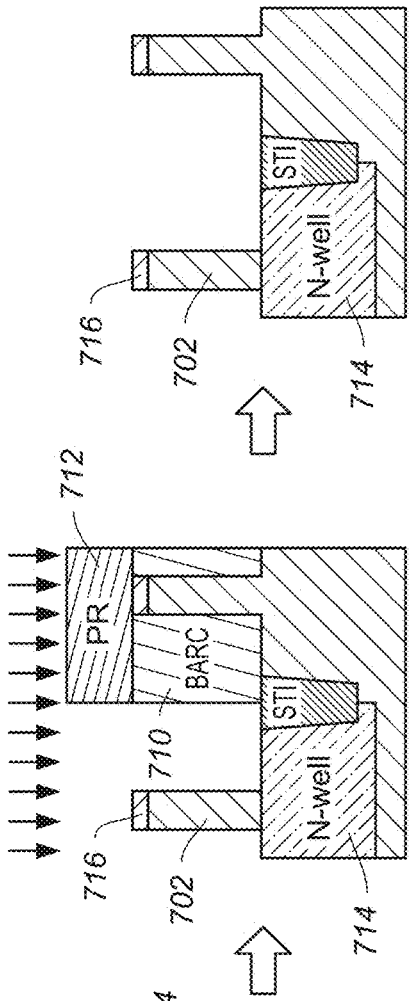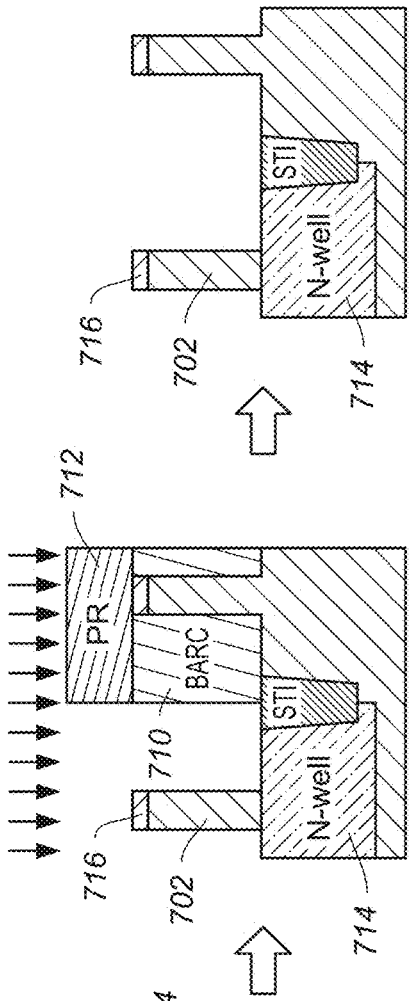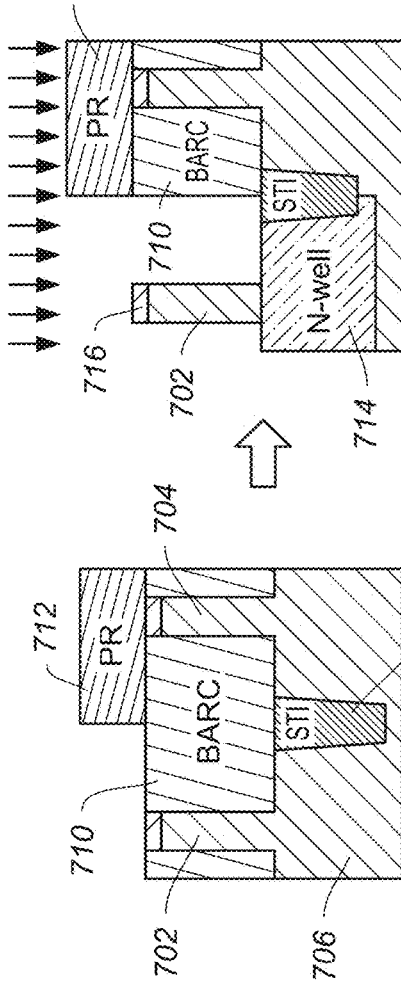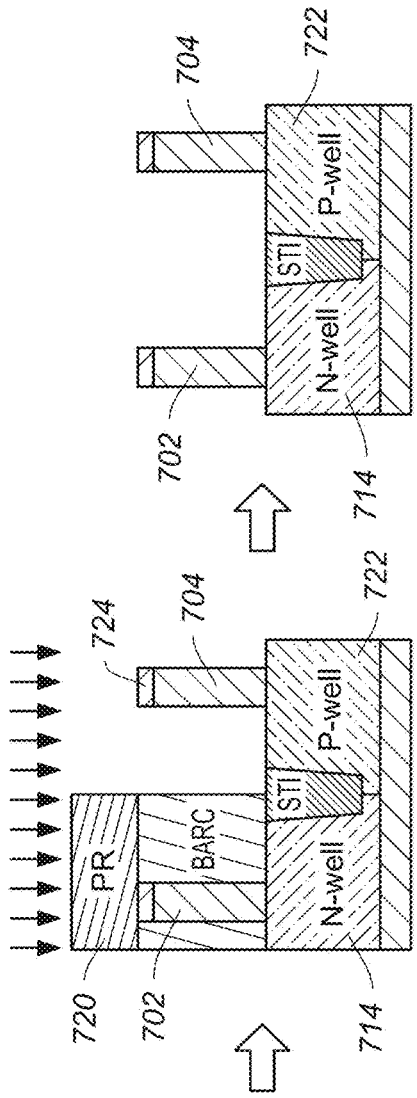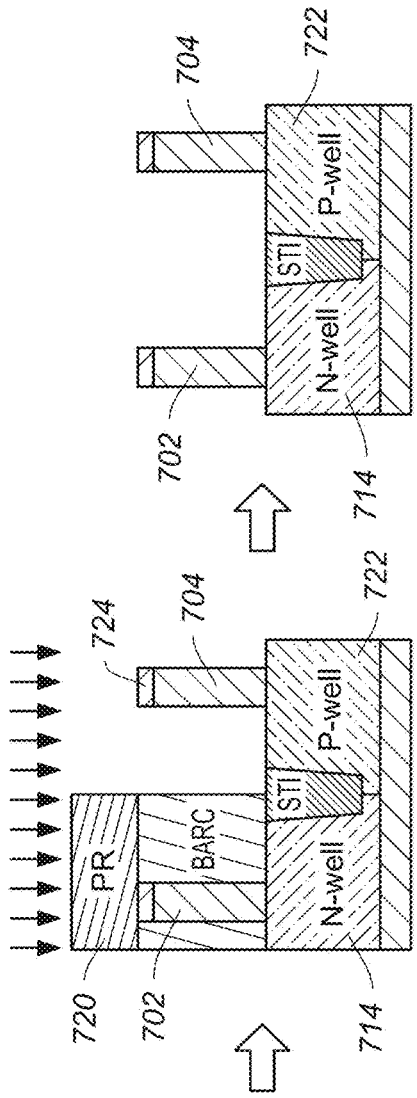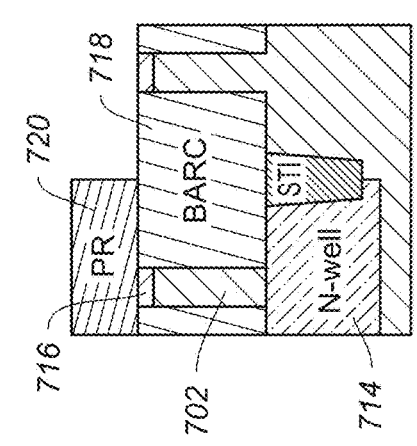

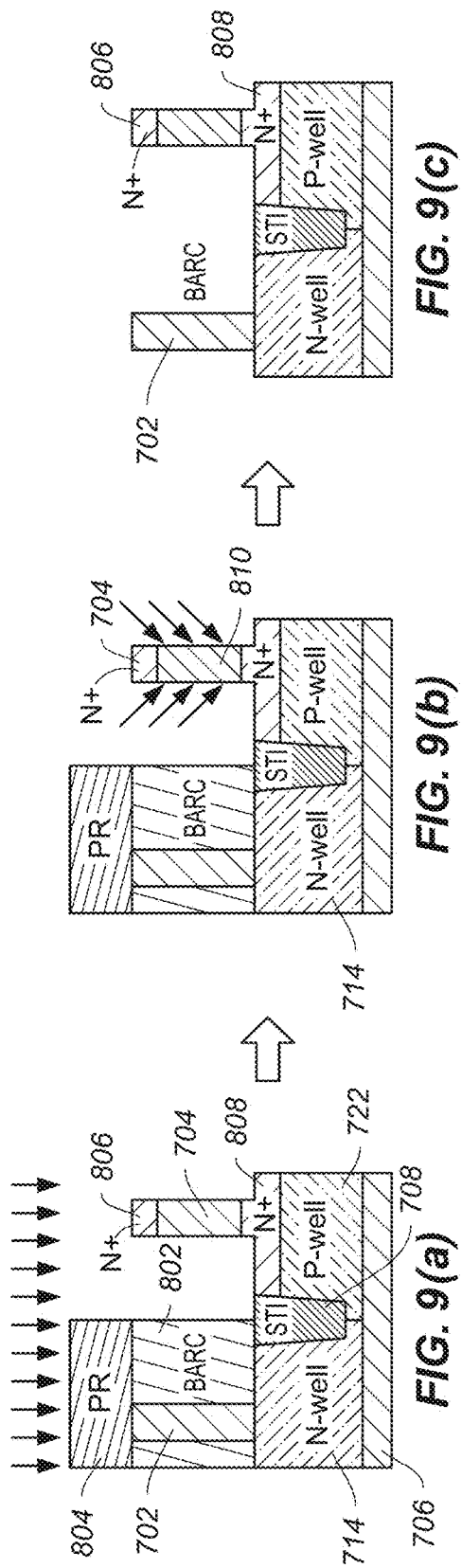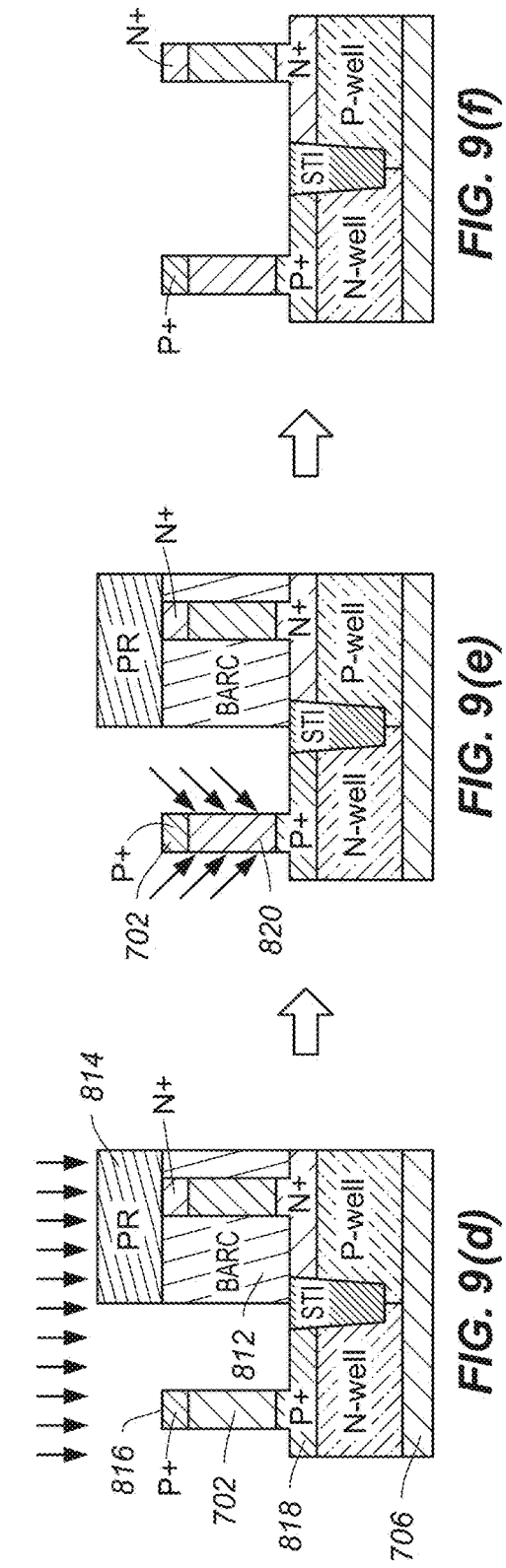

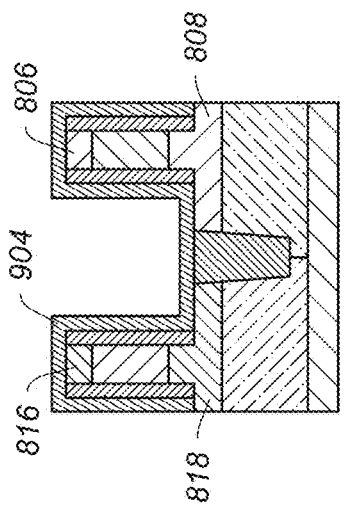
FIG. 10(a)
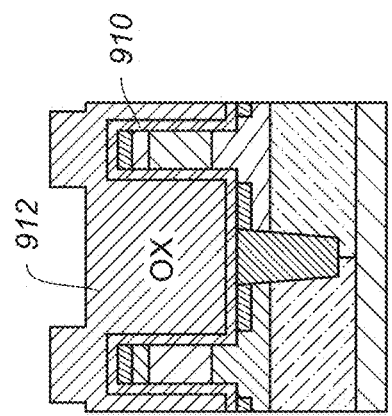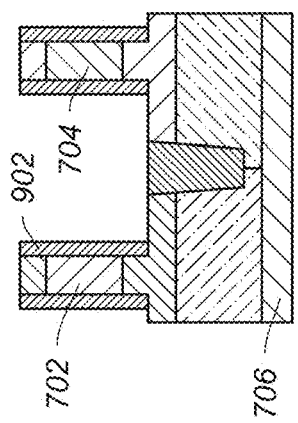
FIG. 10(b)
FIG. 10(c)
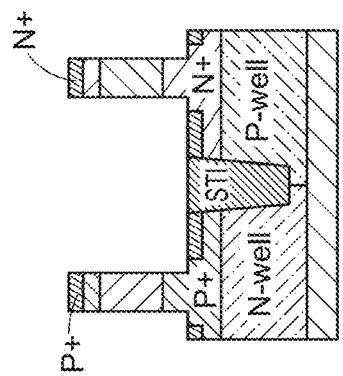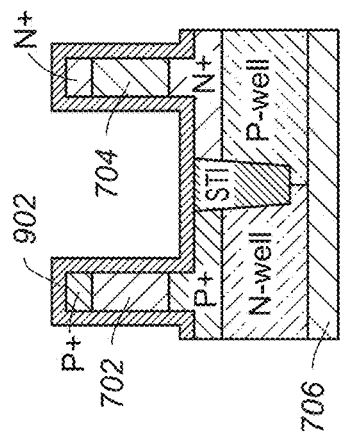
FIG. 10(d)
FIG. 10(e)
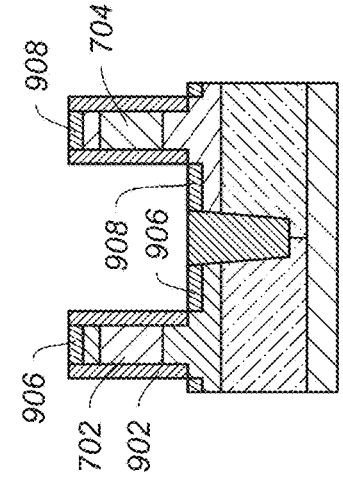
FIG. 10(f)

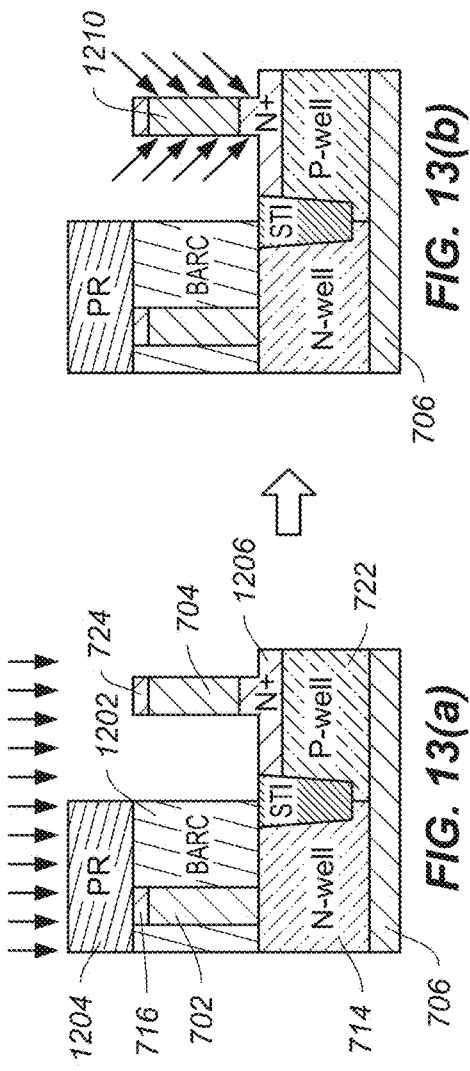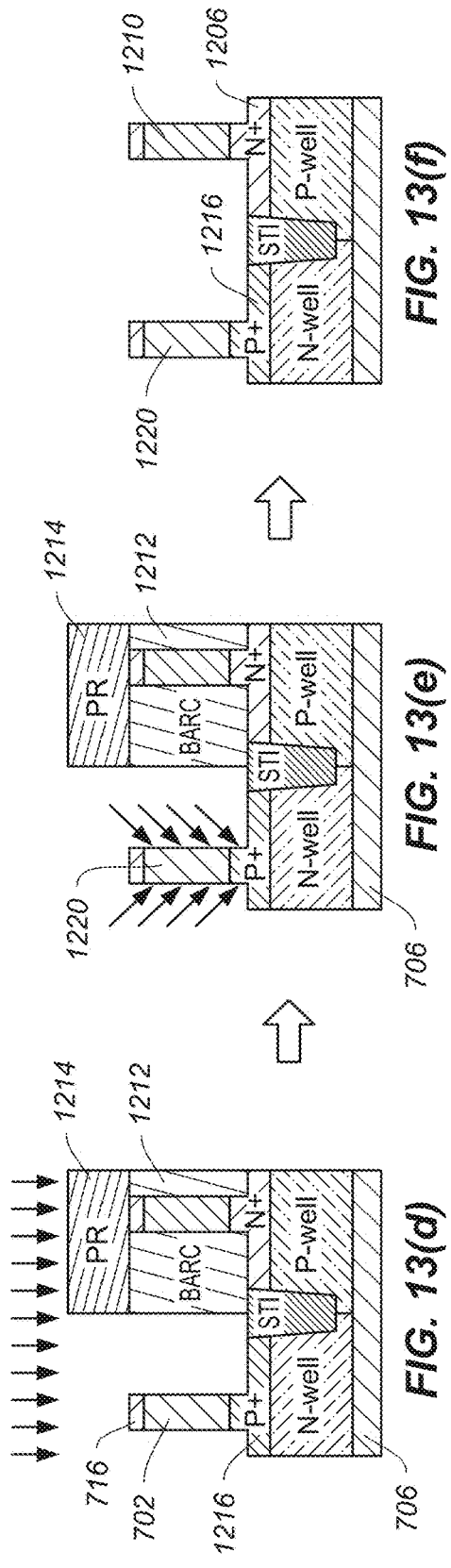

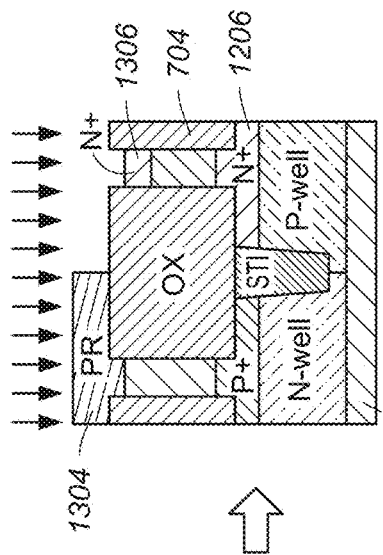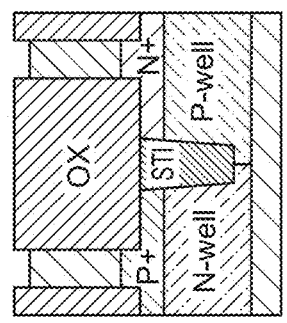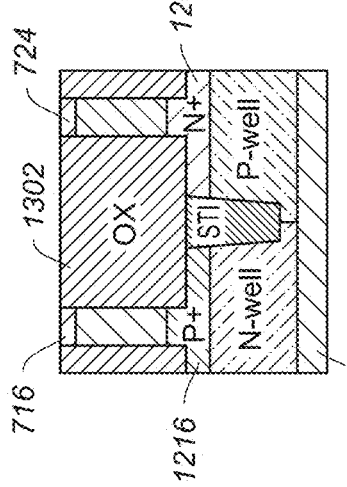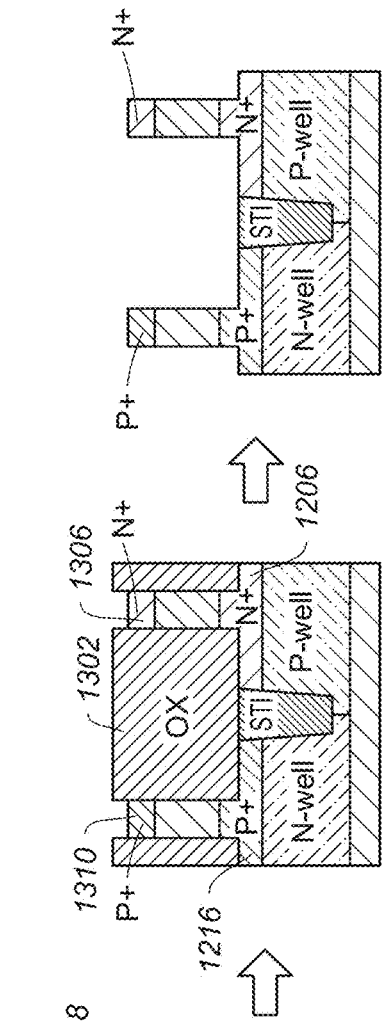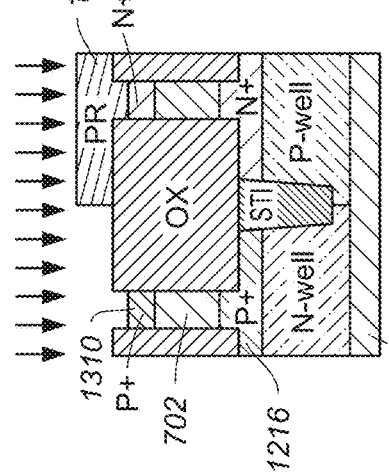
FIG. 14(a) FIG. 14(b) FIG. 14(c) FIG. 14(d) FIG. 14(e) FIG. 14(f)

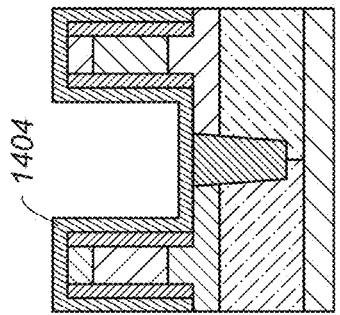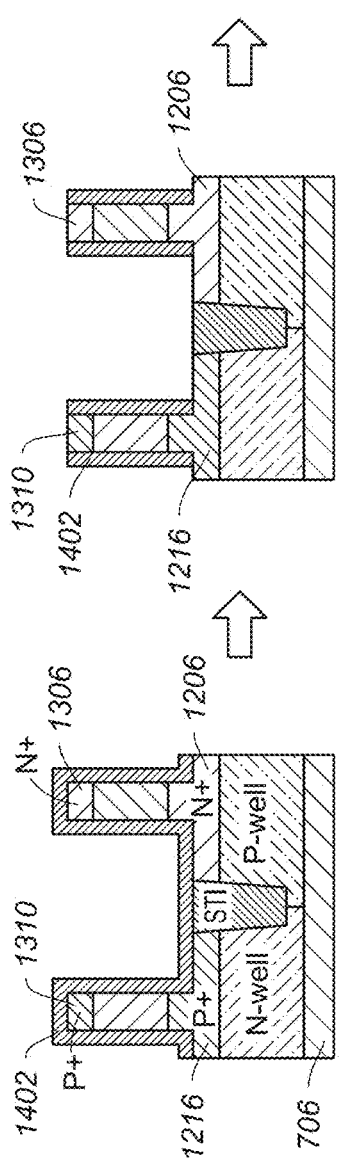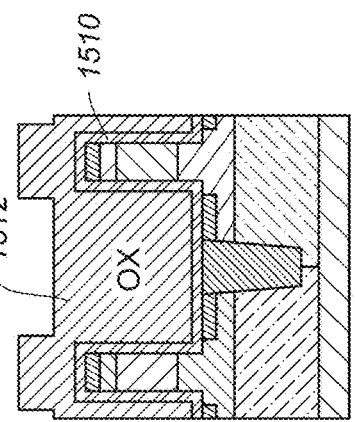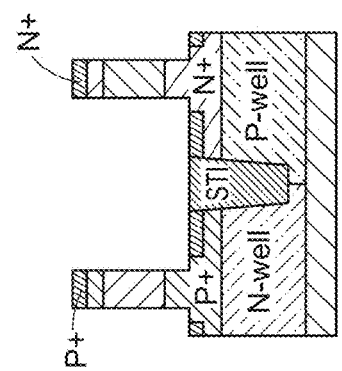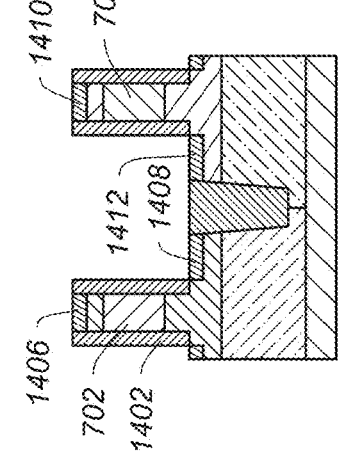
FIG. 15(a)    FIG. 15(b)    FIG. 15(c)
FIG. 15(d)    FIG. 15(e)    FIG. 15(f)

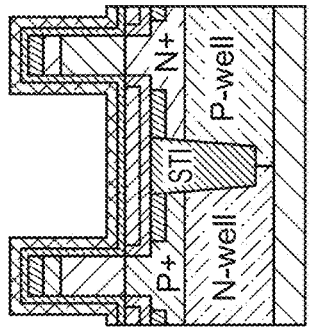 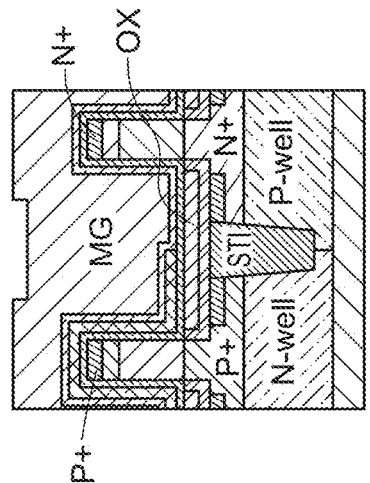
FIG. 16(a)  FIG. 16(b)  FIG. 16(c)  FIG. 16(f)
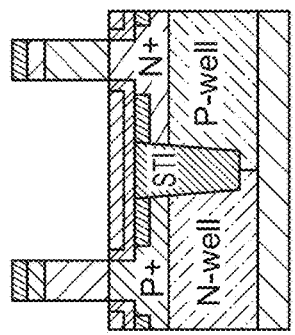 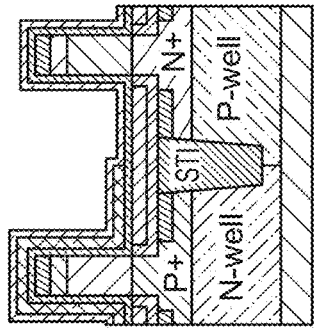
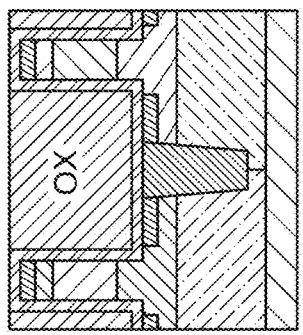 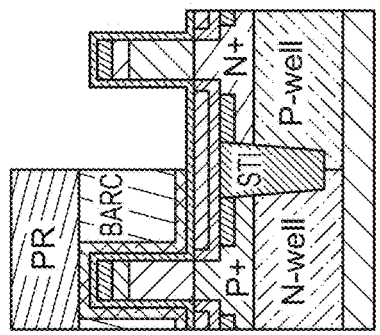
FIG. 16(d)  FIG. 16(e)

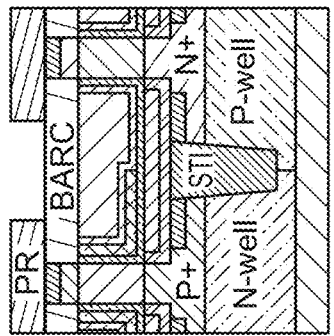
FIG. 17(a)
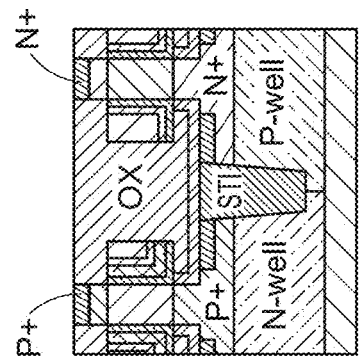
FIG. 17(b)
FIG. 17(c)
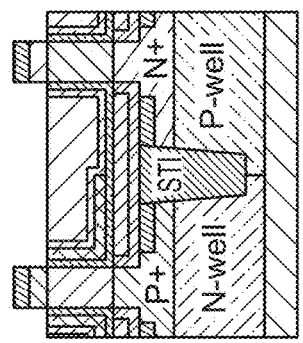
FIG. 17(d)
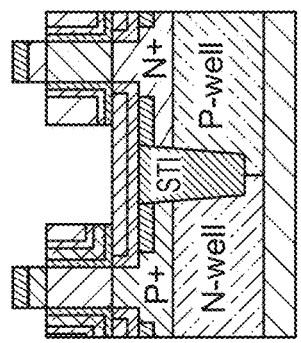
FIG. 17(e)
FIG. 17(f)

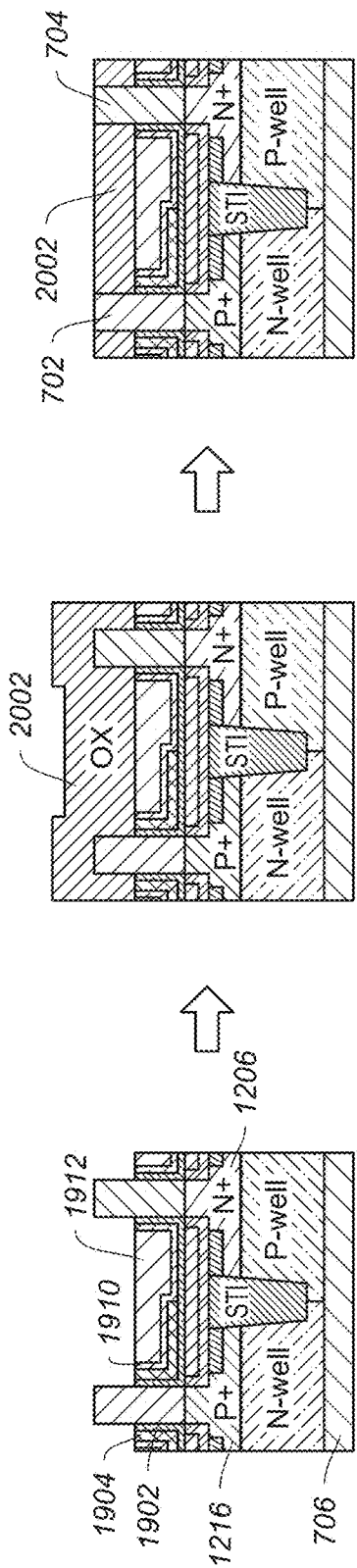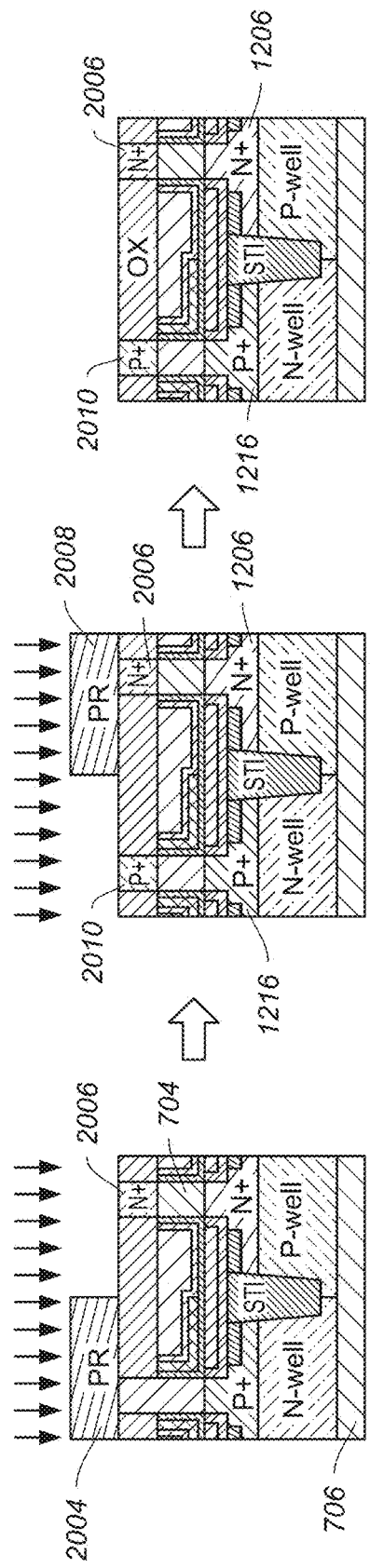

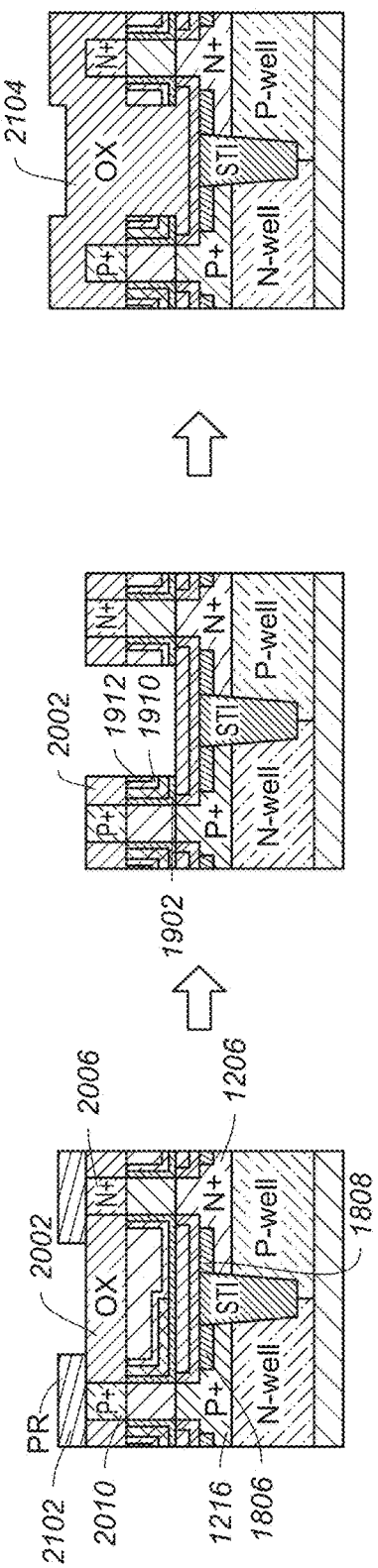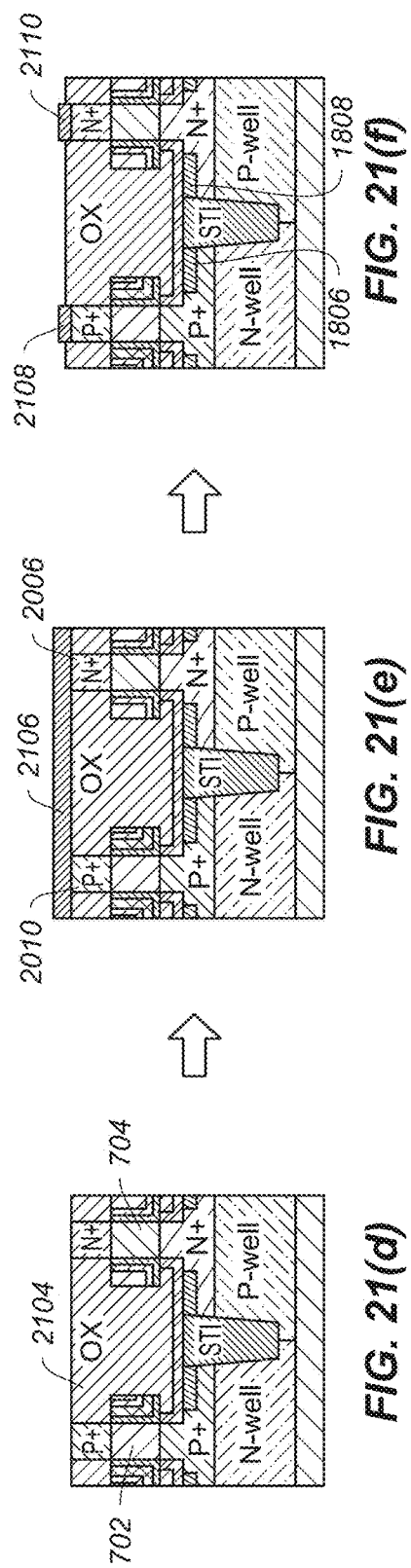

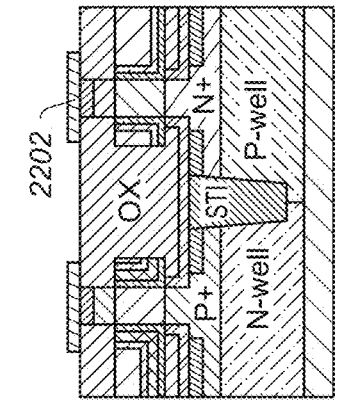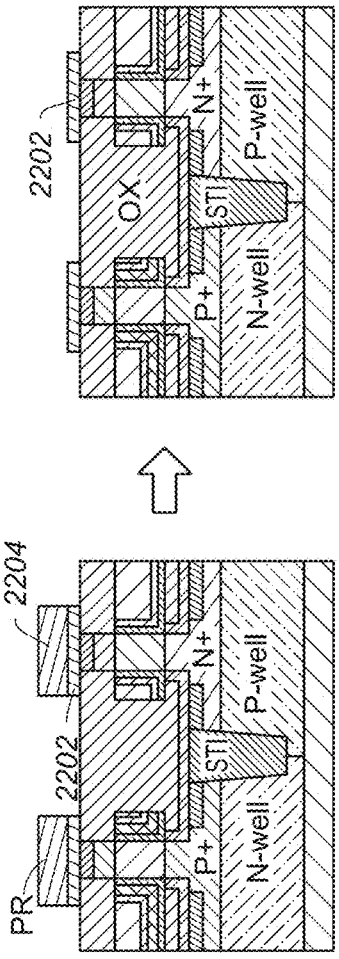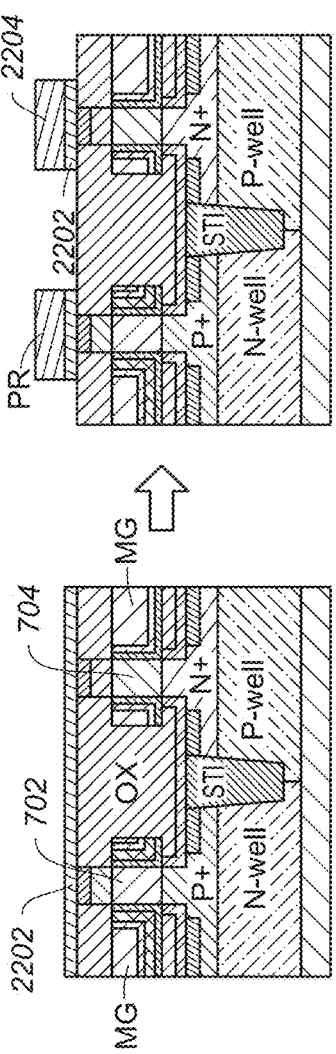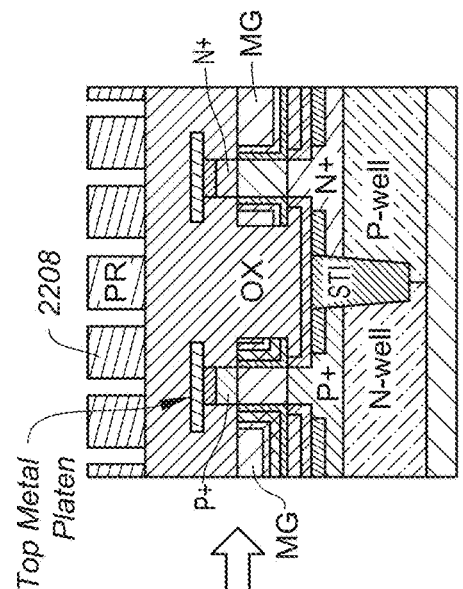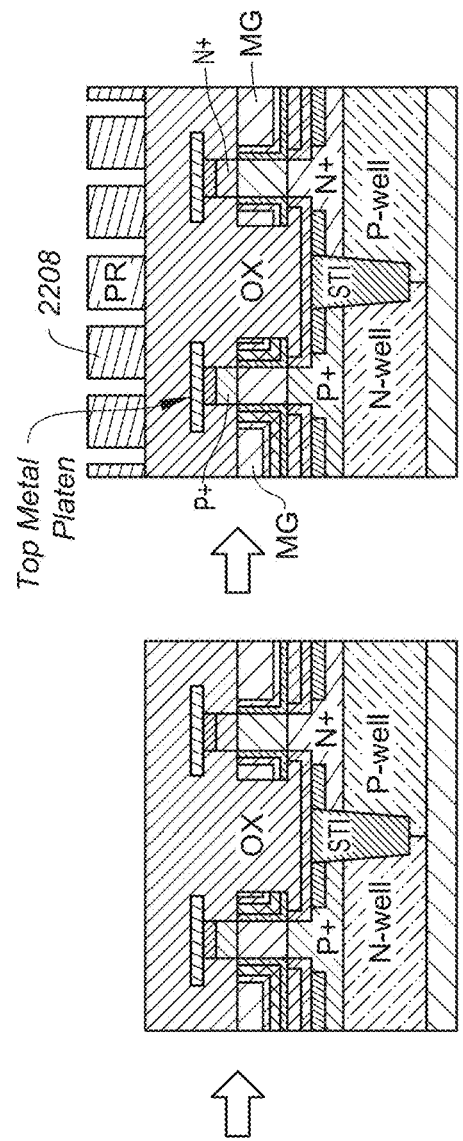
FIG. 22(a)  FIG. 22(b)  FIG. 22(c)  FIG. 22(d)  FIG. 22(e)  FIG. 22(f)

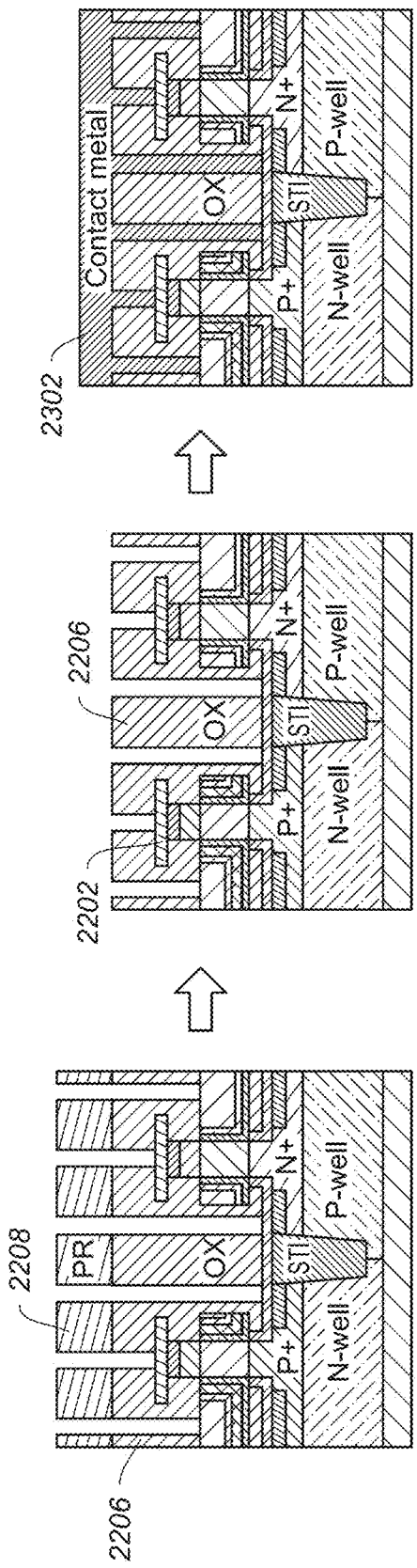
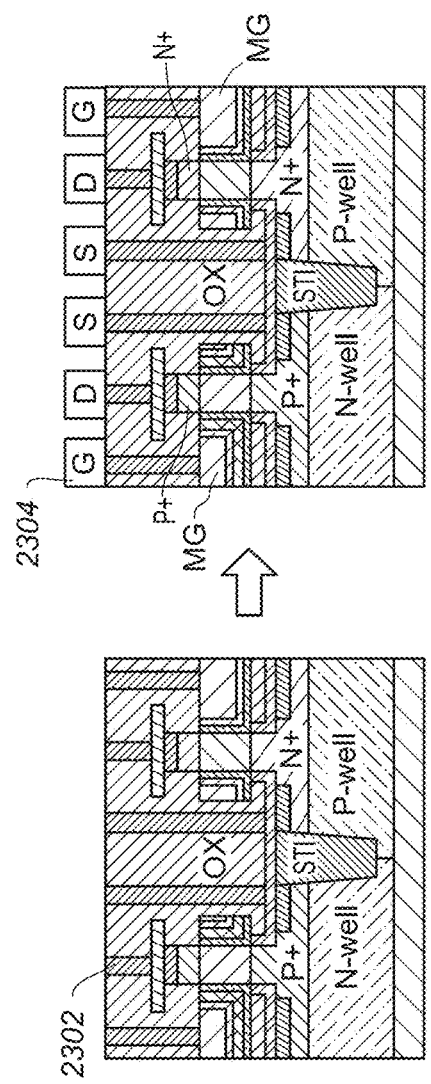
FIG. 23(a)
FIG. 23(b)
FIG. 23(c)
FIG. 23(d)
FIG. 23(e)

METHODS FOR FABRICATING VERTICAL-GATE-ALL-AROUND TRANSISTOR STRUCTURES

BACKGROUND

The technology described in this disclosure relates generally to semiconductor devices and more particularly to fabrication of semiconductor devices.

As feature sizes of semiconductor devices continue to shrink (e.g., into a sub 50 nm regime), various problems, such as short-channel effects and poor sub-threshold characteristics, often become severe in traditional planar devices. Novel device geometries with enhanced performance are needed to push toward higher packing densities in devices and circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3(a)-FIG. 3(e) depict example diagrams showing a process for forming a shallow-trench-isolation (STI) structure.

FIG. 4(a)-FIG. 4(f) depict example diagrams showing a process for forming multiple nanowires after the formation of a STI structure.

FIG. 5(a)-FIG. 5(f) depict other example diagrams showing a process for forming multiple nanowires on a substrate.

FIG. 6(a)-FIG. 6(e) depict other example diagrams showing a process for forming a STI structure after the formation of nanowires.

FIG. 7(a)-FIG. 7(f) depict example diagrams showing a process for forming a N-well and a P-well for nanowires on a substrate.

FIG. 9(a)-FIG. 9(f) depict example diagrams showing a process for forming source/drain regions for nanowires.

FIG. 10(a)-FIG. 10(f) depict example diagrams showing a process for forming source/drain contact regions for nanowires.

FIG. 13(a)-FIG. 13(f) depict example diagrams showing a process for forming bottom source/drain regions for nanowires.

FIG. 14(a)-FIG. 14(f) depict example diagrams showing a process for forming top source/drain regions for nanowires.

FIG. 15(a)-FIG. 15(f) depict other example diagrams showing a process for forming source/drain contact regions for nanowires after the formation of bottom source/drain regions and top source/drain regions.

FIG. 16(a)-FIG. 17(f) depict example diagrams showing a process for forming a gate dielectric material and a gate contact material for nanowires after the formation of source/drain contact regions.

FIG. 20(a)-FIG. 20(f) depict example diagrams showing a process for forming top source/drain regions for nanowires after the formation of a gate dielectric material and a gate contact material.

FIG. 21(a)-FIG. 21(f) depict example diagrams showing a process for forming top source/drain contact regions for nanowires after the formation of top source/drain regions.

FIG. 22(a)-FIG. 22(f) depict example diagrams showing a process for forming top metal platens for nanowires.

FIG. 23(a)-FIG. 23(e) depict example diagrams showing a process for source/drain/gate contact metal formation and back-end-of-line (BEOL) interconnect formation.

DETAILED DESCRIPTION

Figure 1A:
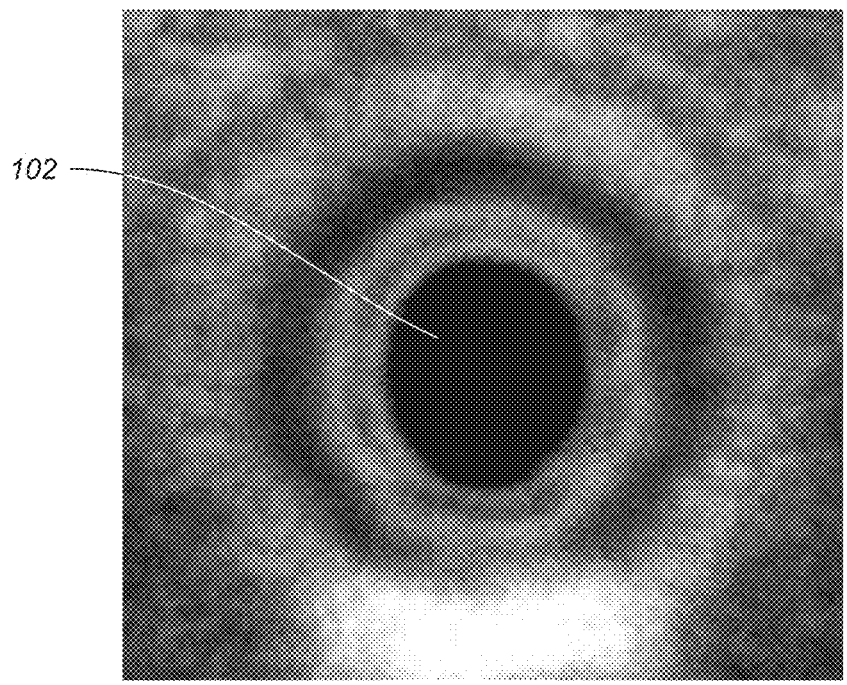
FIG. 1(a) and FIG. 1(b) depict example diagrams showing a nanowire transistor, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "in" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
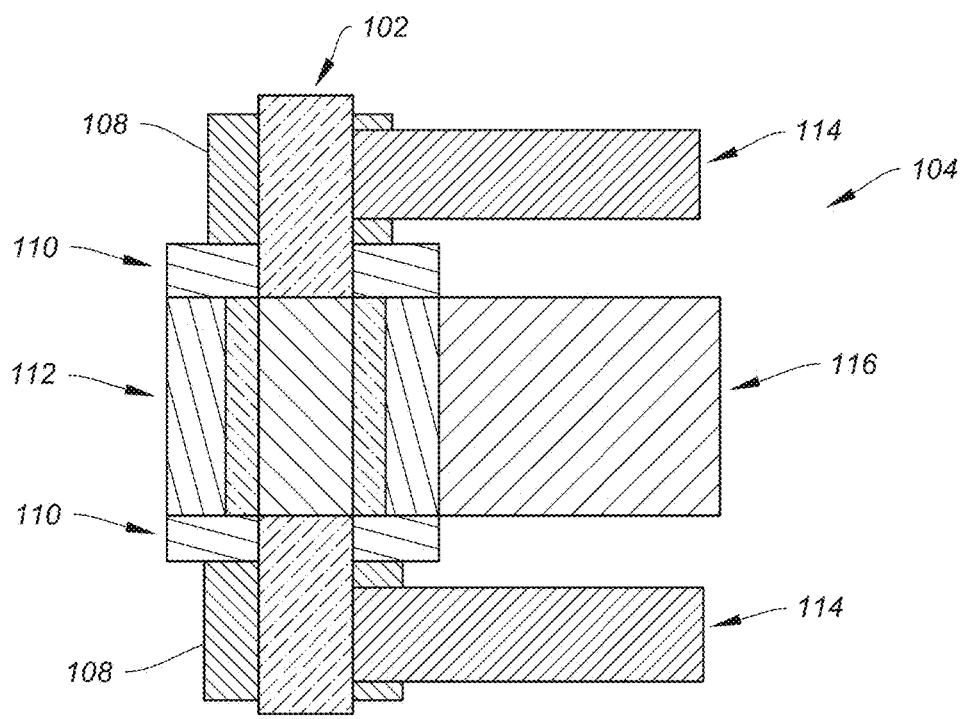

FIG. 1(a) and FIG. 1(b) depict example diagrams showing a nanowire transistor, in accordance with some embodiments. As shown in FIG. 1(a) and FIG. 1(b), a nanowire 102 is formed to fabricate a transistor 104. A channel region is formed in the nanowire 102 between source/drain regions 108. Spacers 110 are formed adjacent to one or more gate layers 112 on the nanowire 102. Source/drain contacts 114 are formed on the source/drain regions 108. In addition, a gate contact 116 is formed on the gate layers 112 that surround at least part of the nanowire 102. In some embodiments, the nanowire 102 is formed on a substrate (not shown) and is substantially vertical relative to the substrate. For example, the diameter of the nanowire 102 is 6 nm. The small size of the nanowire 102 results in volume inversion of the channel 104 and thus reduces short-channel effects.

Figure 2:
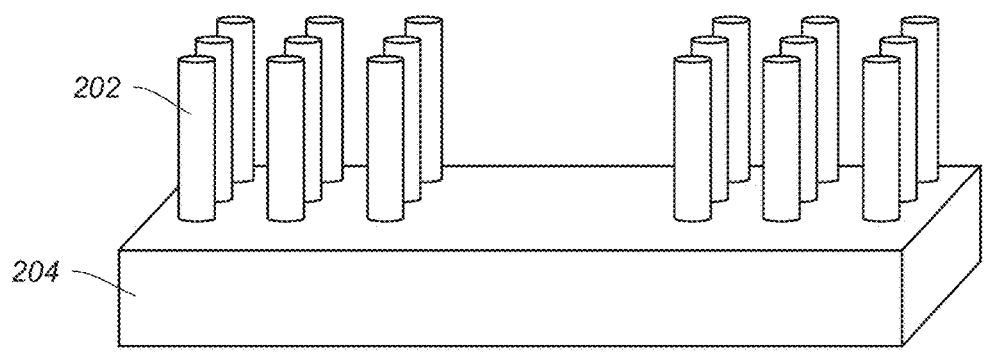
FIG. 2 depicts an example diagram showing multiple nanowires fabricated on a substrate, in accordance with some embodiments.

FIG. 2 depicts an example diagram showing multiple nanowires fabricated on a substrate, in accordance with some embodiments. As shown in FIG. 2, multiple nanowires 202 are fabricated on a substrate 204 and extend substantially vertically relative to the substrate 204. A transistor (e.g., a n-type transistor or a p-type transistor) is fabricated using one or more vertical nanowires 202, where a channel of the transistor is formed in the one or more vertical nanowires 202. For example, the substrate includes silicon, silicon germanium, germanium, one or more III-V materials (e.g., InP, GaAs, AlAs, InAs, InAlAs, InGaAs, InSb, GaSb, and/or InGaSb), or other suitable materials. The nanowires 202 include silicon, silicon germanium, germanium, one or more III-V materials (e.g., InP, GaAs, AlAs, InAs, InAlAs, InGaAs, InSb, GaSb, and/or InGaSb), or other suitable materials. In some embodiments, n-type transistors and p-type transistors are fabricated using the nanowires 202 through processes compatible with a complementary-metal-oxide-semiconductor (CMOS) process flow.

FIG. 3(a)-FIG. 3(e) depict example diagrams showing a process for forming a shallow-trench-isolation (STI) structure. As shown in FIG. 3(a), a mask layer 302 is formed on a substrate 304. For example, the mask layer 302 includes oxides (e.g., silicon oxide), nitrides (e.g., silicon nitride), or other suitable materials. The mask layer 302 is then patterned through, e.g., lithography and etching, as shown in FIG. 3(b). As an example, the thickness of the mask layer 302 is in a range of about 50 nm to about 150 nm. Specifically, a photoresist layer 306 is formed on the mask layer 302 and exposed to a desired pattern of radiation. Then, the photoresist layer 306 is developed using a resist developer. The pattern within the photoresist layer 306 is transferred through the mask layer 302 and into the underlying substrate 304. A single etch (e.g., dry etch or wet etch) or multiple etching can be used for transferring the pattern through the mask layer 302 and into the underlying substrate 304. A dielectric material 310 (e.g., oxides) is deposited on the wafer to fill a gap 308 formed in the substrate 304, as shown in FIG. 3(c). As an example, the depth of the gap 308 is in a range of about 120 nm to about 400 nm. A chemical-mechanical planarization/polishing (CMP) process is carried out to remove part of the dielectric material 310 and stops at the mask layer 302, as shown in FIG. 3(d). The dielectric material 310 (e.g., oxides) is further removed through etching (e.g., dry etching) to form the STI structure 312, as shown in FIG. 3(e). For example, the thickness of the STI structure 312 is in a range of about 20 nm to about 350 nm. For example, the mask layer 302 and the dielectric material 310 are formed through chemical vapor deposition (CVD), plasma enhanced chemical vapor deposition (PECVD), physical vapor deposition (PVD), sputtering, atomic layer deposition (ALD), or other suitable processes.

FIG. 4(a)-FIG. 4(f) depict example diagrams showing a process for forming multiple nanowires after the formation of the STI structure 312. As shown in FIG. 4(a), a bottom-anti-reflective-coating (BARC) layer 402 is formed on the mask layer 302 and the STI structure 312. A photoresist layer 404 is formed on the BARC layer 402, and exposed to a desired pattern of radiation. Then, the photoresist layer 404 is developed using a resist developer to expose part of the BARC layer 402, as shown in FIG. 4(b). The exposed BARC layer 402, part of the mask layer 302 and part of the substrate 304 that are under the exposed BARC layer 402 are removed through, e.g., etching (e.g., dry etching or wet etching), as shown in FIG. 4(c). The remaining BARC layer 402 and the remaining photoresist layer 404 are removed, as shown in FIG. 4(d). An annealing process is carried out for nanowires 406 and 408, as shown in FIG. 4(e). For example, the heights of the nanowires 406 and 408 are in a range of about 20 nm to about 100 nm. For example, the annealing process is performed in hydrogen (e.g., with a pressure in a range of about 7 torr to about 600 torr) at a temperature in a range of about 600° C. to about 1000° C. The nanowires 406 and 408 may be smoothed during the annealing process to become, e.g., elliptical shaped or cylindrical shaped.

As shown in FIG. 4(e), the nanowires 406 and 408 are separated by the STI structure 312 and extend substantially vertically relative to the substrate 304. A top surface of the STI structure 312 is at approximately a same level of a top surface of the substrate 304 after the nanowires 406 and 408 are formed. In some embodiments, the top surface of the STI structure 312 is higher than the top surface of the substrate 304 (not shown in FIG. 4(e)) for about 1 nm to about 25 nm after the nanowires 406 and 408 are formed. In certain embodiments, the top surface of the STI structure 312 is lower than the top surface of the substrate 304 (not shown in FIG. 4(e)) for about 2 nm to about 25 nm after the nanowires 406 and 408 are formed. In some embodiments, the nanowires 406 and 408 are oxidized partially and the formed oxides are stripped (e.g., through etching) to thin down the nanowires 406 and 408. The diameters of the stripped nanowires 406 and 408 are in a range of about 4 nm to about 10 nm. A forest of nanowires may be formed on the substrate 304 according to the processes described above, as shown in FIG. 4(f).

FIG. 5(a)-FIG. 5(f) depict other example diagrams showing a process for forming multiple nanowires on a substrate. As shown in FIG. 5(a), a mask layer 502 is formed on a substrate 504. For example, the mask layer 502 includes oxides (e.g., silicon oxide), nitrides (e.g., silicon nitride), or other suitable materials. The thickness of the mask layer 502 is in a range of about 50 nm to about 150 nm. The mask layer 502 is then patterned using a photoresist layer 506, part of the mask layer 502 is removed (e.g., through etching) to expose the substrate 504, as shown in FIG. 5(b). For example, the mask layer 502 is etched through reactive ion etching (RIE). The photoresist layer 506 is removed, and part of the exposed substrate 504 is etched (e.g., through dry etching) to form nanowires 508 and 510, as shown in FIG. 5(c). For example, the nanowires 508 and 510 extend substantially vertically relative to the substrate 504. An annealing process (e.g., in hydrogen) is carried out for the nanowires 508 and 510, as shown in FIG. 5(d). A dielectric material 512 (e.g., oxides) is formed on the wafer, as shown in FIG. 5(e). A CMP process is carried out to remove part of the dielectric material 512 and stops at the mask layer 502, as shown in FIG. 5(f).

FIG. 6(a)-FIG. 6(e) depict other example diagrams showing a process for forming a STI structure after the formation of the nanowires 508 and 510. As shown in FIG. 6(a), a photoresist layer 602 is formed on wafer and exposed to a desired pattern of radiation. Then, the photoresist layer 602 is developed using a resist developer. The pattern within the photoresist layer 602 is transferred through the dielectric material 512 and into the underlying substrate 504. A single etch (e.g., dry etch or wet etch) or multiple etching can be used for transferring the pattern to form a gap 604. As an example, the depth of the gap 604 is in a range of about 120 nm to about 400 nm. Another dielectric material 606 (e.g., oxides) is deposited on the wafer to fill the gap 604, as shown in FIG. 6(b). A CMP process is carried out to remove part of the dielectric material 606 and stops at the mask layer 502, as shown in FIG. 6(c).

The dielectric material 606 (e.g., oxides) is further removed through etching (e.g., dry etching) to form the STI structure 608, as shown in FIG. 6(d). The nanowires 508 and 510 are separated by the STI structure 608 and extend substantially vertically relative to the substrate 504. A top surface of the STI structure 608 is at approximately a same level of a top surface of the substrate 504 after the nanowires 508 and 510 are formed. In some embodiments, the top surface of the STI structure 608 is higher than the top surface of the substrate 504 (not shown in FIG. 6(d)) for about 1 nm to about 25 nm after the nanowires 508 and 510 are formed. In certain embodiments, the top surface of the STI structure 608 is lower than the top surface of the substrate 504 (not shown in FIG. 6(d)) for about 2 nm to about 25 nm after the nanowires 508 and 510 are formed. A forest of nanowires may be formed on the substrate 504 according to the processes described above, as shown in FIG. 6(e). For example, the thickness of the STI structure 608 is in a range of about 20 nm to about 350 nm. The heights of the nanowires 508 and 510 are in a range of about 20 nm to about 100 nm.

FIG. 7(a)-FIG. 7(f) depict example diagrams showing a process for forming a N-well and a P-well for nanowires on a substrate. As shown in FIG. 7(a), nanowires 702 and 704 (e.g., nanowires 406 and 408, or nanowires 508 and 510) are formed on a substrate 706. A STI structure 708 is formed between the nanowires 702 and 704. A BARC layer 710 is formed on the wafer. In some embodiments, part of the BARC layer 710 is removed, e.g., through etching or CMP. A photoresist layer 712 is formed on the BARC layer 710, and part of the photoresist layer 712 is removed through lithography, as shown in FIG. 7(a).

As shown in FIG. 7(b), part of the BARC layer 710 is removed, e.g., through etching. Ion implantation is performed to form a N-well 714 for the nanowire 702. A hard-mask material 716 protects the nanowire 702 from the ion implantation. The remaining photoresist layer 712 and the remaining BARC layer 710 are removed, as shown in FIG. 7(c). In certain embodiments, an annealing process is carried out for annealing the formed N-well 714.

Figure 8:
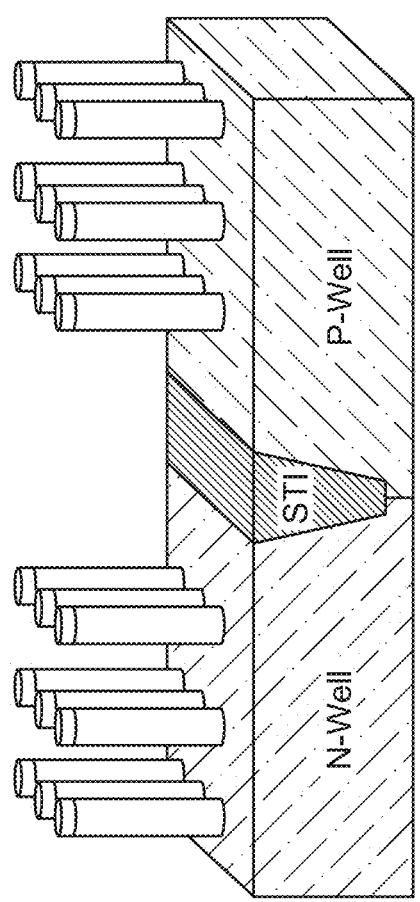
FIG. 8 depicts an example diagram showing a N-well and a P-well formed for multiple nanowires on a substrate.
Figure 11A:
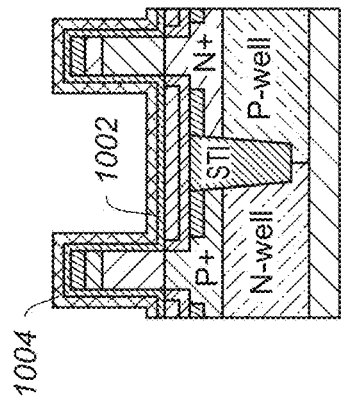
FIG. 11(a)-FIG. 12(f) depict example diagrams showing a process for forming a gate dielectric material and a gate contact material for nanowires.
Figure 11C:
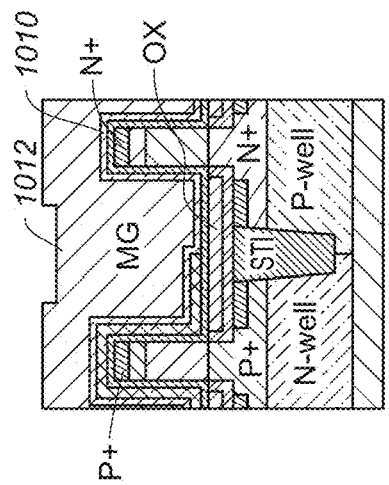
Figure 11B:
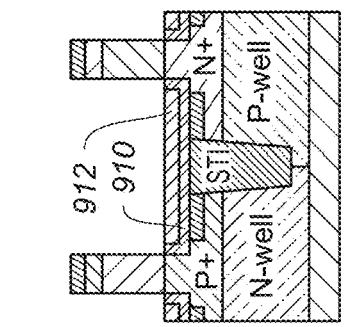
Figure 11E:
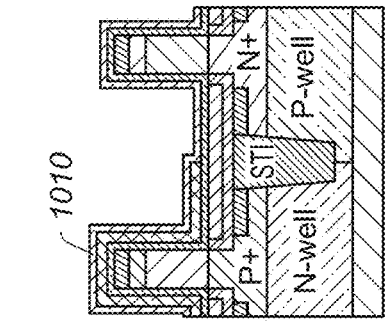
Figure 11D:
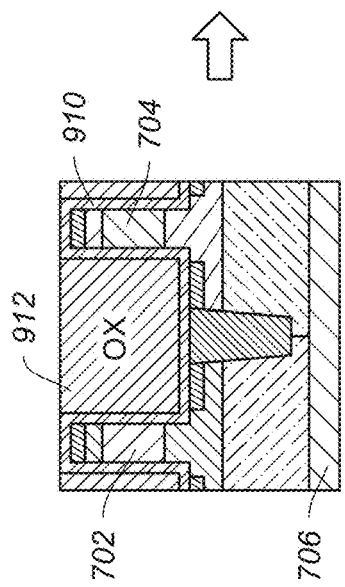
Figure 11F:
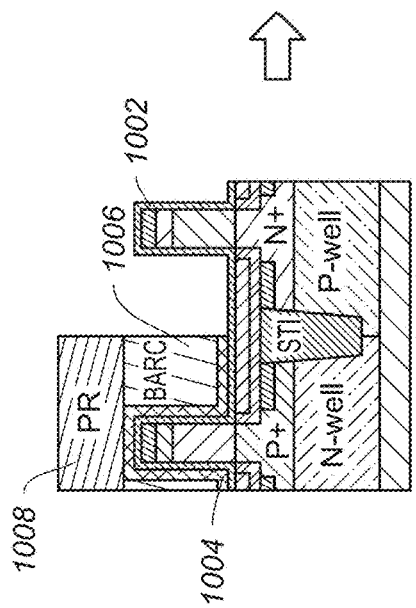
Figure 12A:
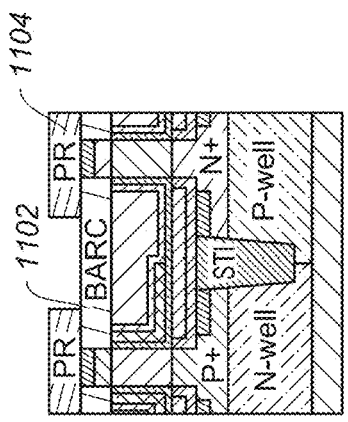
Figure 12B:
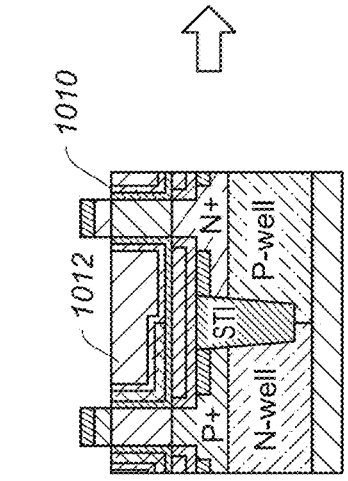
Figure 12C:
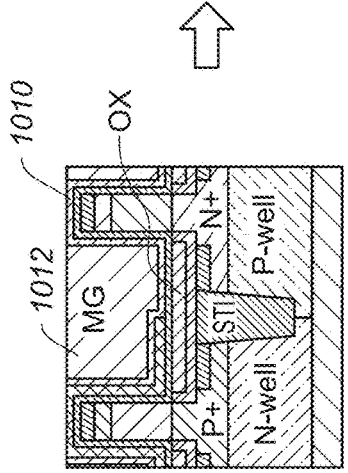
Figure 12D:
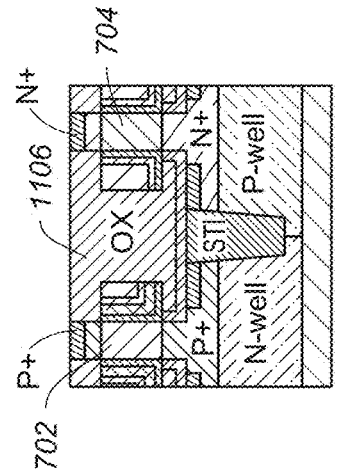
Figure 12E:
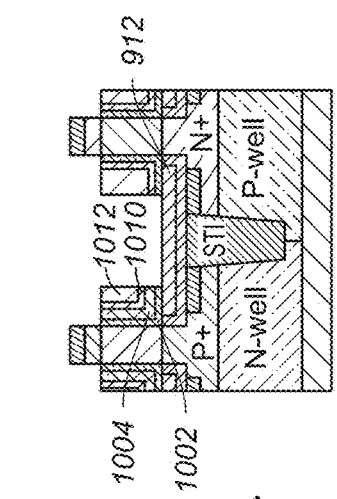
Figure 12F:
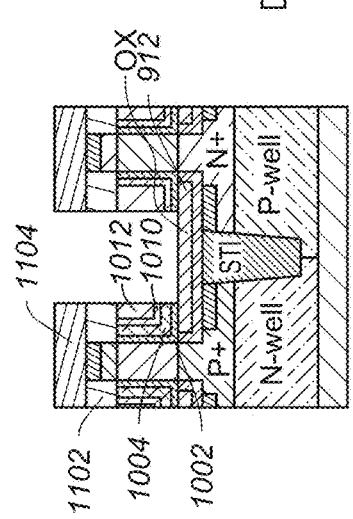

As shown in FIG. 7(d), another BARC layer 718 is formed on the wafer. In some embodiments, part of the BARC layer 718 is removed, e.g., through etching or CMP. A photoresist layer 720 is formed on the BARC layer 718, and part of the photoresist layer 720 is removed through lithography, as shown in FIG. 7(d). Part of the BARC layer 718 is removed, e.g., through etching, and ion implantation is performed to form a P-well 722 for the nanowire 704, as shown in FIG. 7(e). A hard-mask material 724 protects the nanowire 704 from the ion implantation. The remaining photoresist layer 720 and the remaining BARC layer 718 are removed, as shown in FIG. 7(f). An annealing process is carried out for annealing the N-well 714 and the P-well 722. The formation of a N-well and a P-well may be performed for a forest of nanowires on a substrate according to the processes described above, as shown in FIG. 8.

FIG. 9(a)-FIG. 9(f) depict example diagrams showing a process for forming source/drain regions for the nanowires 702 and 704. As shown in FIG. 9(a), a BARC layer 802 is formed on the wafer, and a photoresist layer 804 is formed on the BARC layer 802. Part of the BARC layer 802 and part of the photoresist layer 804 are removed. Ion implantation is performed (e.g., along a direction perpendicular to the substrate 706) to form n-doped source/drain regions 806 and 808 for the nanowire 704. For example, a height associated with the source/drain region 806 is greater than that of the source/drain region 808, relative to the substrate 706. In certain embodiments, an annealing process is carried out for the formed source/drain regions 806 and 808.

In some embodiments, ion implantation is carried out (e.g., along a direction not perpendicular to the substrate 706) to form a doped channel region 810 in the nanowire 704, as shown in FIG. 9(b). For example, the channel region 810 is n-doped for fabricating an accumulation-mode transistor. In another example, the channel region 810 is p-doped for fabricating an inversion-mode transistor. After ion implantation, an annealing process is performed for the channel region 810.

As shown in FIG. 9(c), the remaining BARC layer 802 and the remaining photoresist layer 804 are removed. Another BARC layer 812 is formed on the wafer, and a photoresist layer 814 is formed on the BARC layer 812, as shown in FIG. 9(d). Part of the BARC layer 812 and part of the photoresist layer 814 are removed. Ion implantation is performed (e.g., along a direction perpendicular to the substrate 706) to form p-doped source/drain regions 816 and 818 for the nanowire 702. For example, a height associated with the source/drain region 816 is greater than that of the source/drain region 818, relative to the substrate 706. In some embodiments, an annealing process is carried out for the formed source/drain regions 816 and 818.

In certain embodiments, ion implantation is carried out (e.g., along a direction not perpendicular to the substrate 706) to form a doped channel region 820 in the nanowire 702, as shown in FIG. 9(e). For example, the channel region 820 is p-doped for fabricating an accumulation-mode transistor. In another example, the channel region 820 is n-doped for fabricating an inversion-mode transistor. After ion implantation, an annealing process is performed for the channel region 820. As shown in FIG. 9(f), the remaining BARC layer 812 and the remaining photoresist layer 814 are removed. An annealing process is performed for the formed source/drain regions and/or the channel regions.

FIG. 10(a)-FIG. 10(f) depict example diagrams showing a process for forming source/drain contact regions for the nanowires 702 and 704. As shown in FIG. 10(a), a spacer material 902 (e.g., silicon nitride) is formed on the wafer. For example, the thickness of the spacer material 902 is in a range of about ½ to about 3 times of the diameter of the nanowires 702 and 704. Part of the spacer material 902 is removed, e.g., through etching, as shown in FIG. 10(b). The width of the remaining spacer material 902 adjacent to the nanowires 702 and 704 is in a range of about ⅓ to about 2 times of the diameter of the nanowires 702 and 704. A material layer 904 including a metal-containing material (e.g., Ti, Ni(Pt)) and a cap layer (e.g., TiN) is formed on the wafer, as shown in FIG. 10(c). The thickness of 904 is about ¼ to about ½ of the depths of the source/drain regions 818 and 808 for the nanowires 702 and 704 respectively. An annealing process is performed to form source/drain contact regions 906 associated with the nanowire 702 and source/drain contact regions 908 associated with the nanowire 704, as shown in FIG. 10(d). For example, the contact regions 906 (e.g., silicides) are formed through salicidation of the material layer 904 and the source/drain regions 816 and 818, and the contact regions 908 (e.g., silicides) are formed through salicidation of the material layer 904 and the source/drain regions 806 and 808. The un-reacted material layer 904 is removed, e.g., through wet etching. As shown in FIG. 10(e), the remaining spacer material 902 is removed, e.g., through etching. A contact-etch-stop layer (CESL) 910 and a dielectric material 912 (e.g., oxides) are formed on the wafer, as shown in FIG. 10(*f*). The top surface of the STI structure 708 is about at the same level of the top surface of the contact regions 906 and 908 adjacent to the STI structure 708. In some embodiments, the top surface of the STI structure 708 is higher than the top surface of the contact regions 906 and 908 adjacent to the STI structure 708 about 10 angstroms to about 250 angstroms. In some embodiments, the top surface of the STI structure 708 is lower than the top surface of the contact regions 906 and 908 adjacent to the STI structure 708 about 2 nm to about 45 nm. (Note to agent: similar thickness range applies to the rest of embodiments.)

FIG. 11(*a*)-FIG. 12(*f*) depict example diagrams showing a process for forming a gate dielectric material and a gate contact material for the nanowires 702 and 704. As shown in FIG. 11(*a*), a CMP process is performed to remove part of the dielectric material 912 and stops at the CESL 910. Part of the dielectric material 912 and part of the CESL 910 are removed, e.g., through dry etching, as shown in FIG. 11(*b*). For example, the thickness of the remaining dielectric material 912 over the source/drain regions or the STI structure is about ¼ to about ½ of the heights of the nanowires 702 and 704. A gate dielectric material 1002 including an interfacial layer and a high-k dielectric material is formed on the wafer, and a p-type-work-function metal material 1004 is formed on the gate dielectric material 1002, as shown in FIG. 11(*c*). For example, the high-k dielectric material includes $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, or other suitable materials. As an example, the p-type-work-function-metal material 1004 includes titanium-nitride-containing materials, aluminum-containing materials, or other suitable materials.

As shown in FIG. 11(*d*), a BARC layer 1006 and a photoresist layer 1008 are formed on the wafer, and part of the BARC layer 1006 and part of the photoresist layer 1008 are removed to expose part of the p-type-work-function-metal material 1004. The exposed p-type-work-function-metal material 1004 is removed, e.g., through etching. The remaining BARC layer 1006 and the remaining photoresist layer 1008 are removed. A n-type-work-function-metal material 1010 is formed on the wafer, as shown in FIG. 11(*e*). For example, the n-type-work-function-metal material 1010 includes titanium-nitride-containing materials, lanthanum-containing materials, or other suitable materials. A gate contact material 1012 is formed on the n-type-work-function-metal material 1010, as shown in FIG. 11(*f*). For example, the gate contact material 1012 includes aluminum, tungsten, cobalt, copper, or other suitable materials.

As shown in FIG. 12(*a*), a CMP process is carried out to remove part of the gate contact material 1012 and stops at the n-type-work-function-metal material 1010. Part of the gate contact material 1012 and part of the n-type-work-function-metal material 1010 are removed, e.g., through etching, as shown in FIG. 12(*b*). As shown in FIG. 12(*b*), a BARC layer 1102 is formed on the wafer, and a photoresist layer 1104 is formed on the BARC layer 1102. The photoresist layer 1104 is patterned through lithography to expose part of the BARC layer 1102.

The exposed BARC layer 1102, part of the gate contact material 1012, part of the n-type-work-function-metal material 1010, and part of the gate dielectric material 1002 are removed, e.g., through etching, as shown in FIG. 12(*d*). The remaining BARC layer 1102 and the remaining photoresist layer 1104 are removed, as shown in FIG. 12(*e*). A dielectric material 1106 is formed on the wafer, as shown in FIG. 12(*f*).

A CMP process is performed to remove part of the dielectric material 1106 and stops at top surfaces of the nanowires 702 and 704.

FIG. 13(*a*)-FIG. 13(*f*) depict example diagrams showing a process for forming bottom source/drain regions for the nanowires 702 and 704. As shown in FIG. 13(*a*), a BARC layer 1202 is formed on the wafer, and a photoresist layer 1204 is formed on the BARC layer 1202. Part of the BARC layer 1202 and part of the photoresist layer 1204 are removed. Ion implantation is performed (e.g., along a direction perpendicular to the substrate 706) to form a n-doped source/drain region 1206 in contact with a bottom part of the nanowire 704. The hard-mask material 724 protects a top part of the nanowire 704 from the ion implantation. In some embodiments, an annealing process is carried out for the formed source/drain region 1206.

In certain embodiments, ion implantation is carried out (e.g., along a direction not perpendicular to the substrate 706) to form a doped channel region 1210 in the nanowire 704, as shown in FIG. 13(*b*). For example, the channel region 1210 is n-doped for fabricating an accumulation-mode transistor. In another example, the channel region 1210 is p-doped for fabricating an inversion-mode transistor. After ion implantation, an annealing process is performed for the channel region 1210.

As shown in FIG. 13(*c*), the remaining BARC layer 1202 and the remaining photoresist layer 1204 are removed. Another BARC layer 1212 is formed on the wafer, and a photoresist layer 1214 is formed on the BARC layer 1212, as shown in FIG. 13(*d*). Part of the BARC layer 1212 and part of the photoresist layer 1214 are removed. Ion implantation is performed (e.g., along a direction perpendicular to the substrate 706) to form a p-doped source/drain region 1216 in contact with a bottom part of the nanowire 702. The hard-mask material 716 protects a top part of the nanowire 702 from the ion implantation. In some embodiments, an annealing process is carried out for the formed source/drain region 1216.

In certain embodiments, ion implantation is carried out (e.g., along a direction not perpendicular to the substrate 706) to form a doped channel region 1220 in the nanowire 702, as shown in FIG. 13(*e*). For example, the channel region 1220 is p-doped for fabricating an accumulation-mode transistor. In another example, the channel region 1220 is n-doped for fabricating an inversion-mode transistor. After ion implantation, an annealing process is performed for the channel region 1220. As shown in FIG. 13(*f*), the remaining BARC layer 1212 and the remaining photoresist layer 1214 are removed. An annealing process is performed for the formed source/drain regions 1206 and 1216 and/or the channel regions 1210 and 1220.

FIG. 14(*a*)-FIG. 14(*f*) depict example diagrams showing a process for forming top source/drain regions for the nanowires 702 and 704. As shown in FIG. 14(*a*), a dielectric material 1302 (e.g., oxides) is formed on the wafer. A CMP process is performed to remove part of the dielectric material 1302 and stops at the hard-mask materials 716 and 724. As shown in FIG. 14(*b*), the hard-mask materials 716 and 724 are removed, e.g., through etching. As shown in FIG. 14(*c*), a photoresist layer 1304 is formed on the wafer and part of the photo resist layer 1304 is removed to expose the nanowire 704. Ion implantation is performed (e.g., along a direction perpendicular to the substrate 706) to form a n-doped source/drain region 1306 in a top part of the nanowire 704. The remaining photoresist layer 1304 is removed.

As shown in FIG. 14(d), another photoresist layer 1308 is formed on the wafer and part of the photo resist layer 1308 is removed to expose the nanowire 702. Ion implantation is performed (e.g., along a direction perpendicular to the substrate 706) to form a p-doped source/drain region 1310 in a top part of the nanowire 702. The remaining photoresist layer 1308 is removed, as shown in FIG. 14(e). A high-temperature annealing process is performed to activate dopants in the source/drain regions 1206, 1216, 1306 and 1310. The dielectric material 1302 is removed, e.g., through etching, as shown in FIG. 14(f).

FIG. 15(a)-FIG. 15(f) depict other example diagrams showing a process for forming source/drain contact regions for the nanowires 702 and 704 after the formation of the bottom source/drain regions and the top source/drain regions. As shown in FIG. 15(a), a spacer material 1402 (e.g., silicon nitride) is formed on the wafer. For example, the thickness of the spacer material 902 is in a range of about ½ to about 3 times of the diameter of the nanowires 702 and 704. Part of the spacer material 1402 is removed, e.g., through etching, as shown in FIG. 15(b). The width of the remaining spacer material 1402 adjacent to the nanowires 702 and 704 is in a range of about ⅓ to about 2 times of the diameter of the nanowires 702 and 704. A material layer 1404 including a metal-containing material (e.g., Ti, Ni(Pt)) and a cap layer (e.g., TiN) is formed on the wafer, as shown in FIG. 15(c). The thickness of 1404 is about ¼ to about ½ of the depths of the source/drain regions 818 and 808 for the nanowires 702 and 704 respectively. An annealing process is performed to form source/drain contact regions 1406 and 1408 associated with the nanowire 702 and form source/drain contact regions 1410 and 1412 associated with the nanowire 704, as shown in FIG. 15(d). For example, the contact regions 1406 and 1408 (e.g., silicides) are formed through salicidation of the material layer 1404 and the source/drain regions 1310 and 1216, respectively. The contact regions 1410 and 1412 (e.g., silicides) are formed through salicidation of the material layer 1404 and the source/drain regions 1306 and 1206, respectively. The un-reacted material layer 1404 is removed, e.g., through wet etching. As shown in FIG. 15(e), the remaining spacer material 1402 is removed, e.g., through etching. A contact-etch-stop layer (CESL) 1510 and a dielectric material 1512 (e.g., oxides) are formed on the wafer, as shown in FIG. 15(f). The top surface of the STI structure is at about the same level of the top surface of the contact regions 1408 and 1412 adjacent to the STI structure. In some embodiments, the top surface of the STI structure is higher than the top surface of the contact regions 1408 and 1412 adjacent to the STI structure for about 1 nm to about 25 nm. In some embodiments, the top surface of the STI structure is lower than the top surface of the contact regions 1408 and 1412 adjacent to the STI structure for about 2 nm to about 45 nm.

FIG. 16(a)-FIG. 17(f) depict example diagrams showing a process for forming a gate dielectric material and a gate contact material for the nanowires 702 and 704 after the formation of the source/drain contact regions. The process shown in FIG. 16(a)-FIG. 17(f) is similar to the process shown in FIG. 11(a)-FIG. 12(f).

Figure 18A:
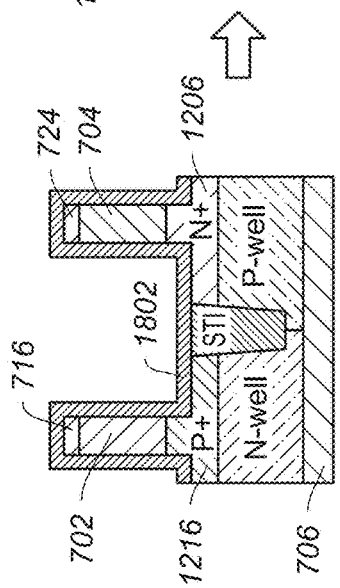
FIG. 18(a)-FIG. 18(f) depict other example diagrams showing a process for forming bottom source/drain contact regions for nanowires after the formation of bottom source/drain regions.
Figure 18B:
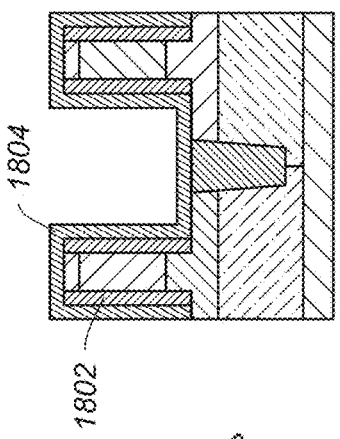
Figure 18C:
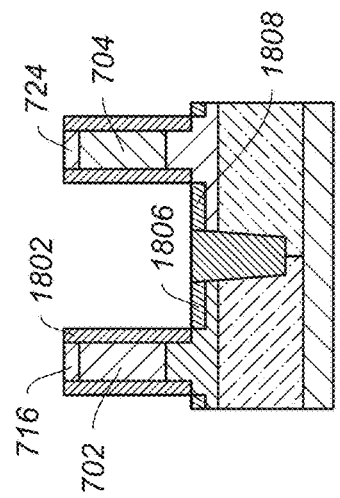
Figure 18D:
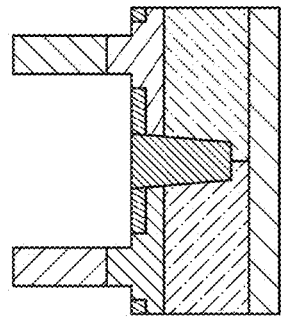
Figure 18E:
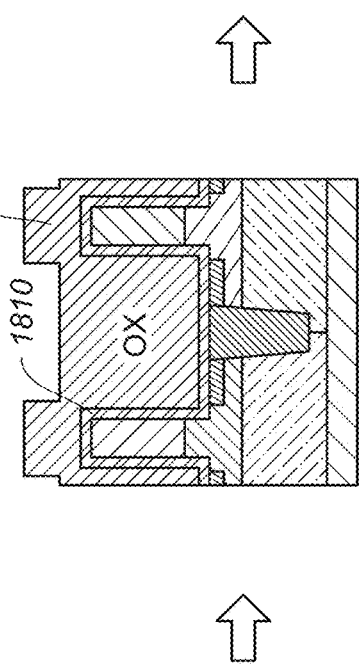
Figure 18F:
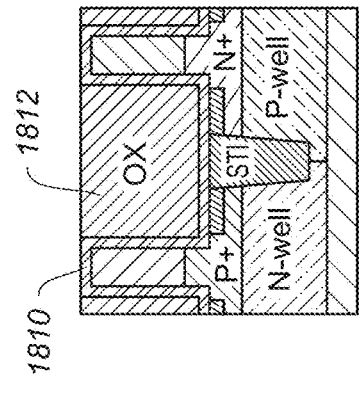

FIG. 18(a)-FIG. 18(f) depict other example diagrams showing a process for forming bottom source/drain contact regions for the nanowires 702 and 704 after the formation of the bottom source/drain regions. As shown in FIG. 18(a), a spacer material 1802 (e.g., silicon nitride) is formed on the wafer. Part of the spacer material 1802 is removed, e.g., through etching. A material layer 1804 including a metal-containing material (e.g., Ti, Ni(Pt)) and a cap layer (e.g., TiN) is formed on the wafer, as shown in FIG. 18(b). An annealing process is performed to form a bottom source/drain contact region 1806 associated with the nanowire 702 and form a bottom source/drain contact region 1808 associated with the nanowire 704, as shown in FIG. 18(c). For example, the contact regions 1806 and 1808 (e.g., silicides) are formed through salicidation of the material layer 1804 and the bottom source/drain regions 1216 and 1206, respectively. The un-reacted material layer 1804 is removed, e.g., through wet etching. As shown in FIG. 18(d), the remaining spacer material 1802 is removed and the hard-mask materials 716 and 724 are removed, e.g., through etching. A contact-etch-stop layer (CESL) 1810 and a dielectric material 1812 (e.g., oxides) are formed on the wafer, as shown in FIG. 18(e). A CMP process is performed to remove part of the dielectric material 1812 and stops at the CESL 1810, as shown in FIG. 18(f).

Figure 19A:
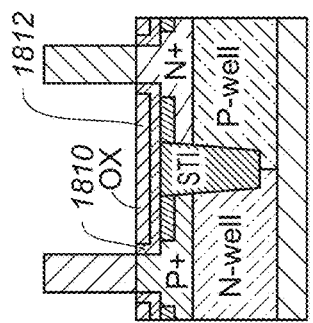
FIG. 19(a)-FIG. 19(f) depict example diagrams showing a process for forming a gate dielectric material and a gate contact material for nanowires after the formation of bottom source/drain contact regions.
Figure 19B:
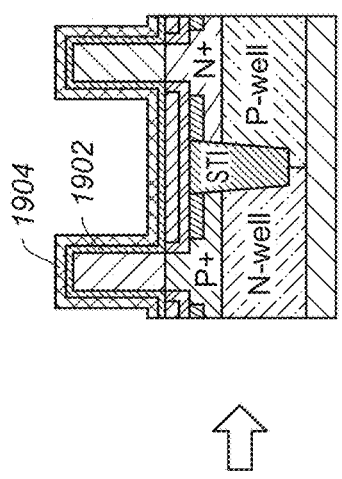
Figure 19C:
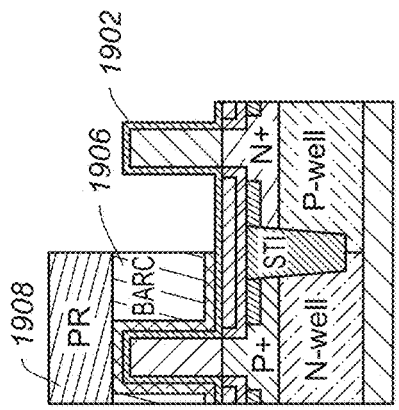
Figure 19D:
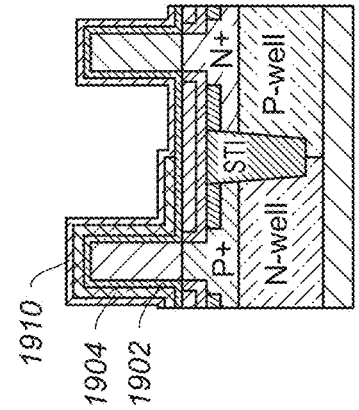
Figure 19E:
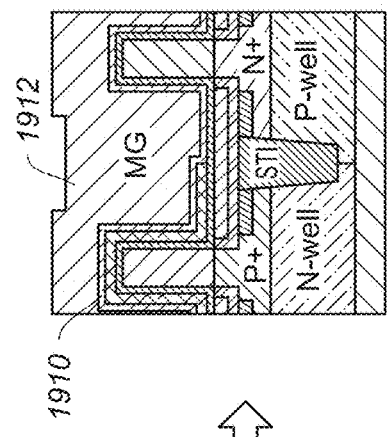
Figure 19F:
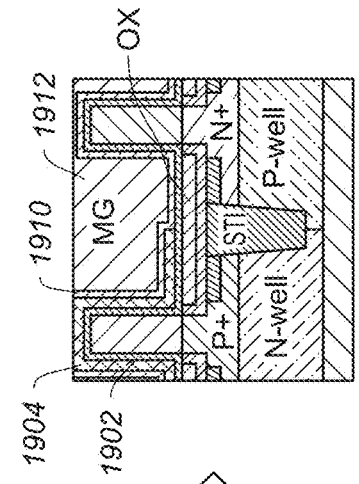

FIG. 19(a)-FIG. 19(f) depict example diagrams showing a process for forming a gate dielectric material and a gate contact material for the nanowires 702 and 704 after the formation of the bottom source/drain contact regions. As shown in FIG. 19(a), part of the dielectric material 1812 and part of the CESL 1810 are removed, e.g., through dry etching. For example, the thickness of the remaining dielectric material 1812 over the source/drain regions or the STI structure is about ¼ to about ½ of the heights of the nanowires 702 and 704. A gate dielectric material 1902 including an interfacial layer and a high-k dielectric material is formed on the wafer, and a p-type-work-function metal material 1904 is formed on the gate dielectric material 1902, as shown in FIG. 19(b). As shown in FIG. 19(c), a BARC layer 1906 and a photoresist layer 1908 are formed on the wafer, and part of the BARC layer 1906 and part of the photoresist layer 1908 are removed to expose part of the p-type-work-function-metal material 1904. The exposed p-type-work-function-metal material 1904 is removed, e.g., through etching. The remaining BARC layer 1906 and the remaining photoresist layer 1908 are removed. A n-type-work-function-metal material 1910 is formed on the wafer, as shown in FIG. 19(d). A gate contact material 1912 is formed on the n-type-work-function-metal material 1910, as shown in FIG. 19(e). For example, the gate contact material 1912 includes aluminum, tungsten, cobalt, copper, or other suitable materials. As shown in FIG. 19(f), a CMP process is carried out to remove part of the gate contact material 1912 and stops at the n-type-work-function-metal material 1910.

FIG. 20(a)-FIG. 20(f) depict example diagrams showing a process for forming top source/drain regions for the nanowires 702 and 704 after the formation of the gate dielectric material 1902 and the gate contact material 1912. As shown in FIG. 20(a), part of the gate contact material 1912 and part of the n-type-work-function-metal material 1910 are removed, e.g., through etching, as shown in FIG. 20(a). As shown in FIG. 20(b), a dielectric material 2002 is formed on the wafer. A CMP process is performed to remove part of the dielectric material 2002 and stops at the top surfaces of the nanowires 702 and 704, as shown in FIG. 20(c).

A photoresist layer 2004 is formed on the wafer, and part of the photoresist layer 2004 is removed to expose a top part of the nanowire 704, as shown in FIG. 20(d). Ion implantation is performed (e.g., along a direction perpendicular to the substrate 706) to form a n-doped source/drain region 2006 in a top part of the nanowire 704. The remaining photoresist layer 2004 is removed.

As shown in FIG. 20(e), another photoresist layer 2008 is formed on the wafer and part of the photo resist layer 2008 is removed to expose the nanowire 702. Ion implantation is performed (e.g., along a direction perpendicular to the substrate 706) to form a p-doped source/drain region 2010 in a top part of the nanowire 702. The remaining photoresist layer 2008 is removed, as shown in FIG. 20(f). A high-temperature annealing process is performed to activate dopants in the source/drain regions 1206, 1216, 2006 and 2010.

FIG. 21(a)-FIG. 21(f) depict example diagrams showing a process for forming top source/drain contact regions for the nanowires 702 and 704 after the formation of the top source/drain regions. As shown in FIG. 21(a), a photoresist layer 2102 is formed on the wafer, and part of the photoresist 2102 is removed to expose part of the dielectric material 2002. The exposed dielectric material 2002, part of the gate contact material 1912, part of the n-type-work-function-metal material 1910, and part of the gate dielectric material 1902 are removed, e.g., through etching. The remaining photoresist layer 2102 is removed, as shown in FIG. 21(b). A dielectric material 2104 (e.g., oxides) is formed on the wafer, as shown in FIG. 21(c). A CMP process is performed to remove part of the dielectric material 2104 and stops at top surfaces of the nanowires 702 and 704, as shown in FIG. 21(d).

A material layer 2106 including a metal-containing material (e.g., Ti, Ni(Pt)) and a cap layer (e.g., TiN) is formed on the wafer, as shown in FIG. 21(e). An annealing process is performed to form a top source/drain contact region 2108 associated with the nanowire 702 and form a top source/drain contact region 2110 associated with the nanowire 704, as shown in FIG. 21(f). For example, the contact regions 2108 and 2110 (e.g., silicides) are formed through salicidation of the material layer 2106 and the source/drain regions 2010 and 2006, respectively. The un-reacted material layer 2106 is removed, e.g., through wet etching.

FIG. 22(a)-FIG. 22(f) depict example diagrams showing a process for forming top metal platens for the nanowires 702 and 704. As shown in FIG. 22(a), a top metal material 2202 is formed on the wafer. For example, the top metal material 2202 includes titanium, titanium nitride, tungsten, aluminum, cobalt, copper, or other suitable materials. A photoresist layer 2204 is formed and part of the photoresist layer 2204 is removed to expose part of the top metal material 2202. The exposed top metal material 2202 is removed, e.g., through dry etching, as shown in FIG. 22(b). The remaining photoresist layer 2204 is removed, as shown in FIG. 22(c).

An inter-layer-dielectric (ILD) layer 2206 (e.g., oxides) is formed on the wafer, as shown in FIG. 22(d). A CMP process is performed to remove part of the ILD layer 2206, as shown in FIG. 22(e). Another photoresist layer 2208 is formed on the ILD layer 2206, and patterned through lithography for source/drain/gate contact metal formation, as shown in FIG. 22(f).

FIG. 23(a)-FIG. 23(e) depict example diagrams showing a process for source/drain/gate contact metal formation and back-end-of-line (BEOL) interconnect formation. As shown in FIG. 23(a), the patterned photoresist layer 2208 is used as a mask for removing part of the ILD layer 2206. The remaining photoresist layer 2008 is removed, as shown in FIG. 23(b). One or more contact metal materials 2302 (e.g., Ti/TiN/W) are formed, as shown in FIG. 23(c). A CMP process is performed to remove part of the contact metal materials 2302 to form source/drain/gate contact structures, as shown in FIG. 23(d). Interconnect structures 2304 (e.g., copper) are formed during one or more BEOL interconnect processes, as shown in FIG. 23(e). The thickness of the CESL is about ¼ to about 4 times of the diameter of the nanowire 702. For example, the thickness of the CESL 1810 is in a range of about 2 nm to about 20 nm as a buffer layer for removing part of the ILD layer 2206, e.g., through etching.

Figure 24:
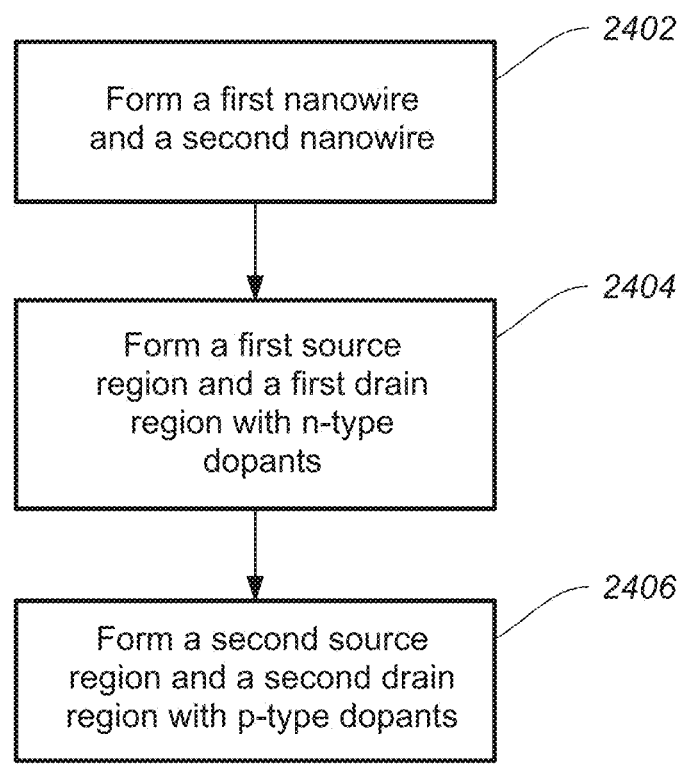
FIG. 24 depicts an example flow chart for fabricating multiple devices on a substrate, in accordance with some embodiments.

FIG. 24 depicts an example flow chart for fabricating multiple devices on a substrate, in accordance with some embodiments. At 2402, a first nanowire (e.g., the nanowire 704) and a second nanowire (e.g., the nanowire 702) are formed on a substrate, the first nanowire and the second nanowire extending substantially vertically relative to the substrate. At 2404, a first source region (e.g., the source/drain region 806 or 808, the source/drain region 1206 or 1306) and a first drain region (e.g., the source/drain region 806 or 808, the source/drain region 1206 or 1306) are formed with n-type dopants, the first nanowire being disposed between the first source region and the first drain region. At 2406, a second source region (e.g., the source/drain region 816 or 818, the source/drain region 1216 or 1310) and a second drain region (e.g., the source/drain region 816 or 818, the source/drain region 1216 or 1310) are formed with p-type dopants, the second nanowire being disposed between the second source region and the second drain region.

The present disclosure describes vertical gate-all-around nanowire arrays (e.g., with salicided source/drain contact regions, scaled high-k dielectric materials and metal gate structures) fabricated using processes compatible with a CMOS process flow. In some embodiments, the structures, devices and methods described herein are configured to reduce short channel effects, reduce device-to-device variability and achieve nanometer-gate-length patterning without high-resolution lithography.

According to one embodiment, a method is provided for fabricating nanowire devices on a substrate. A first nanowire and a second nanowire are formed on a substrate, the first nanowire and the second nanowire extending substantially vertically relative to the substrate. A first source region and a first drain region are formed with n-type dopants, the first nanowire being disposed between the first source region and the first drain region. A second source region and a second drain region are formed with p-type dopants, the second nanowire being disposed between the second source region and the second drain region.

According to another embodiment, a structure includes: a first nanowire, a first source region, a first drain region, a second nanowire, a second source region, and a second drain region. The first nanowire is formed on a substrate and extends substantially vertically relative to the substrate. The first source region includes first n-type dopants, and the first drain region includes second n-type dopants. The first nanowire is disposed between the first source region and the first drain region. The second nanowire is formed on the substrate and extends substantially vertically relative to the substrate. The second source region includes first p-type dopants, and the second drain region includes second p-type dopants. The second nanowire is disposed between the second source region and the second drain region.

According to yet another embodiment, a device includes a n-type transistor and a p-type transistor. The n-type transistor includes: a first source region in contact with a first end of one or more first nanowires formed on a substrate, the first end being associated with a first height relative to the substrate; a first drain region in contact with a second end of the first nanowires, the second end being associated with a second height relative to the substrate, the second height being different from the first height; and a first channel region in the first nanowires configured to conduct a first current between the first source region and the first drain region. The p-type transistor includes: a second source region in contact with a third end of one or more second nanowires formed on the substrate, the third end being associated with a third height relative to the substrate; a second drain region in contact with a fourth end of the second nanowires, the fourth end being associated with a fourth height relative to the substrate, the fourth height being different from the third height; and a second channel region in the second nanowires configured to conduct a second current between the second source region and the second drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating nanowire devices on a substrate, the method comprising:
    forming a first nanowire and a second nanowire on a substrate, the first nanowire and the second nanowire extending substantially vertically relative to the substrate, wherein forming the first nanowire and the second nanowire comprises:
        forming a patterned mask layer on the substrate;
        etching part of the substrate exposed by the patterned mask layer to form the first nanowire and the second nanowire;
    forming an N-well within the substrate beneath the second nanowire after forming the first and second nanowires;
    forming a shallow trench isolation structure embedded within the substrate;
    forming a P-well within the substrate beneath the first nanowire after forming the first and second nanowires;
    forming a first source region and a first drain region within the first nanowire with n-type dopants, a first channel region within the first nanowire being vertically disposed between the first source region and the first drain region, wherein at least one of the first source region and the first drain region includes a first extended region of the first nanowire extending perpendicular to the first channel region at a surface region of the P-well;
    forming a second source region and a second drain region within the second nanowire with p-type dopants, a second channel region within the second nanowire being vertically disposed between the second source region and the second drain region, wherein at least one of the second source region and the second drain region includes a second extended region of the second nanowire extending perpendicular to the second channel region at a surface region of the N-well, and,
    wherein the shallow trench isolation structure separates the first extended region from the second extended region and the P-well from the N-well.

2. The method of claim 1, wherein
    the first source region and the first drain region are formed through ion implantation at a first time; and
    the second source region and the second drain region are formed through ion implantation at a second time, the second time being different from the first time.

3. The method of claim 1, further comprising:
    performing ion implantation on the first channel region in the first nanowire along a tilted direction to the substrate; and
    performing ion implantation on the second channel region in the second nanowire along a tilted direction to the substrate.

4. The method of claim 1, further comprising:
    forming first contact regions on the first source region, the first extended region, and the first drain region of the first nanowire, wherein one of the first source region or the first drain region comprises the first extended region; and
    forming second contact regions on the second source region, the second extended region, and the second drain region of the second nanowire.

5. The method of claim 4, further comprising:
    forming a metal-containing material on the first source region, the second source region, the first drain region and the second drain region, wherein one of the first source region or the first drain region comprises the first extended region and one of the second source region and the second drain region comprises the second extended region;
    forming a cap layer on the metal-containing material; and
    annealing the cap layer and the metal-containing material to form the first contact regions and the second contact regions.

6. The method of claim 1, further comprising:
    forming a first dielectric material on the first nanowire, the first dielectric material surrounding at least part of the first nanowire; and
    forming a second dielectric material on the second nanowire, the second dielectric material surrounding at least part of the second nanowire.

7. The method of claim 1, further comprising:
    forming one or more third nanowires on the substrate, the third nanowires extending substantially vertically relative to the substrate;
    wherein the one or more third nanowires and the first nanowire are used to fabricate a n-type transistor.

8. The method of claim 1, further comprising:
    forming one or more fourth nanowires on the substrate, the fourth nanowires extending substantially vertically relative to the substrate;
    wherein the one or more fourth nanowires and the second nanowire are used for fabricating a p-type transistor.

9. The method of claim 1, wherein the patterned mask layer is patterned using a photoresist layer.

10. The method of claim 4, wherein the first contact regions and the second contact regions are formed through salicidation.

11. A method for fabricating nanowire devices on a substrate, the method comprising:
    forming a pair of nanowires on a substrate extending substantially vertically relative to the substrate, wherein forming the pair of nanowires comprises:
        forming a patterned mask layer on the substrate; and
        etching part of the substrate exposed by the patterned mask layer to form the at least two nanowires;

forming an N-well within the substrate beneath one nanowire of the pair of nanowires after forming the at least two nanowires;

forming a shallow trench isolation structure embedded within the substrate; and forming a P-well within the substrate beneath another nanowire of the pair of nanowires after forming the at least two nanowires, wherein the shallow trench isolation structure separates the pair of nanowires from each other and the P-well from the N-well; and forming a source region and a drain region within each nanowire of the pair of nanowires, wherein the source region and the drain region within a nanowire of the pair of nanowires has n-type dopants and the source region and drain region within another nanowire of the pair of nanowires has p-type dopants, and wherein at least one of the source regions and the drain regions includes an extended region extending perpendicular to the pair of nanowires at a surface region of at least one of the P-well and N-well.

12. The method of claim 1, wherein a channel region is vertically disposed within the source region and the drain region of each nanowire.

13. The method of claim 11, wherein the source region, the extended region, and the drain region for each nanowire are formed through ion implantation.

14. The method of claim 11, further comprising forming a contact region on the source region, the extended region, and the drain region of each nanowire through salicidation, wherein one of the source region or the drain region comprises the extended region.

15. The method of claim 14, further comprising forming a metal-containing material on the source region, the extended region, and the drain region of each nanowire, wherein one of the source region or the drain region comprises the extended region.

16. The method of claim 15, further comprising forming a cap layer on the metal-containing material.

17. The method of claim 16, further comprising annealing the cap layer and the metal-containing material to form the contact regions.

18. The method of claim 11, wherein the patterned mask layer is patterned using a photoresist layer.

19. A method for forming a nanowire device on a substrate, the method comprising:

forming a patterned mask layer on the substrate;

etching part of the substrate exposed by the patterned mask layer to form a first nanowire and a second nanowire, wherein the first nanowire and the second nanowire extending substantially vertically relative to the substrate;

forming a first source region and a first drain region within the first nanowire with n-type dopants, a first channel region within the first nanowire being vertically disposed between the first source region and the first drain region, wherein at least one of the first source region and the first drain region includes a first extended region of the first nanowire extending beneath and perpendicular to the first channel region;

forming an N-well within the substrate beneath the second nanowire after forming the first and second nanowires;

forming a shallow trench isolation structure embedded within the substrate;

forming a P-well within the substrate beneath the first nanowire after forming the first and second nanowires, wherein the first extended region is formed at a surface region of the P-well; and forming a second source region and a second drain region within the second nanowire with p-type dopants, a second channel region within the second nanowire being vertically disposed between the second source region and the second drain region, wherein at least one of the second source region and the second drain region includes a second extended region of the second nanowire extending beneath and perpendicular to the second channel region, wherein the second extended region is formed at a surface region of the N-well, and wherein the shallow trench isolation structure separates the first extended region from the second extended region and the P-well from the N-well.

* * * * *